(12) United States Patent
Ito et al.

(10) Patent No.: US 7,019,388 B2
(45) Date of Patent: Mar. 28, 2006

(54) SEMICONDUCTOR DEVICE

(75) Inventors: Fujio Ito, Hanno (JP); Hiromichi Suzuki, Tokyo (JP); Hiroyuki Takeno, Koganei (JP); Hiroshi Shimoji, Hamura (JP); Fumio Murakami, Kodaira (JP); Keiko Kurakawa, Ome (JP)

(73) Assignees: Renesas Technology Corp., Tokyo (JP); Hitachi ULSI Systems Co., Ltd., Tokyo (JP); Renesas Eastern Japan Semiconductor, Inc., Tokyo (JP)

( * ) Notice: Subject to any disclaimer, the term of this patent is extended or adjusted under 35 U.S.C. 154(b) by 21 days.

(21) Appl. No.: 10/729,950

(22) Filed: Dec. 9, 2003

(65) Prior Publication Data

US 2004/0124506 A1 Jul. 1, 2004

(30) Foreign Application Priority Data

Dec. 26, 2002 (JP) .............................. 2002-378625

(51) Int. Cl.
*H01L 23/495* (2006.01)
(52) U.S. Cl. .................. 257/666; 257/676; 257/787
(58) Field of Classification Search ................ 257/459, 257/676, 786, 100, 433, 434, 687, 767–796, 257/81, 99, 666–677
See application file for complete search history.

(56) References Cited

U.S. PATENT DOCUMENTS

| 5,977,615 | A  | * | 11/1999 | Yamaguchi et al. | ........ | 257/666 |
| 6,177,718 | B1 | * | 1/2001  | Kozono           | ........ | 257/666 |
| 6,208,020 | B1 | * | 3/2001  | Minamio et al.   | ........ | 257/684 |
| 6,338,984 | B1 | * | 1/2002  | Minamio et al.   | ........ | 438/123 |
| 6,828,661 | B1 | * | 12/2004 | Araki et al.     | ........ | 257/676 |
| 2002/0121670 | A1 | * | 9/2002 | Minamio et al. | ........ | 257/459 |
| 2003/0015775 | A1 | * | 1/2003 | Minamio et al. | ........ | 257/676 |

FOREIGN PATENT DOCUMENTS

| JP | 04133453 A | * | 5/1992 |
| JP | 07176678 A | * | 7/1995 |
| JP | 3072291    |   | 5/2000 |
| JP | 2001-189410 |  | 7/2001 |

* cited by examiner

*Primary Examiner*—Andy Huynh
(74) *Attorney, Agent, or Firm*—Miles & Stockbridge P.C.

(57) ABSTRACT

It is intended to improve the production yield of QFN (Quad Flat Non-leaded package) and attain a multi-pin structure. After a resin sealing member for sealing a semiconductor chip is formed by molding, a peripheral portion of the resin sealing member and a lead frame are both cut along a cutting line which is positioned inside (on a central side of the resin sealing member) of a line (molding line) extending along an outer edge of the resin sealing member, whereby the whole surface (upper and lower surfaces and both side faces) of each of leads exposed to side faces (cut faces) of the resin sealing member is covered with resin, thus preventing the occurrence of metallic burrs on the cut faces of the leads.

7 Claims, 49 Drawing Sheets

APPEARANCE OF QFN (BACK SIDE)

INTERNAL STRUCTURE OF QFN (SURFACE SIDE)

INTERNAL STRUCTURE OF QFN (BACK SIDE)

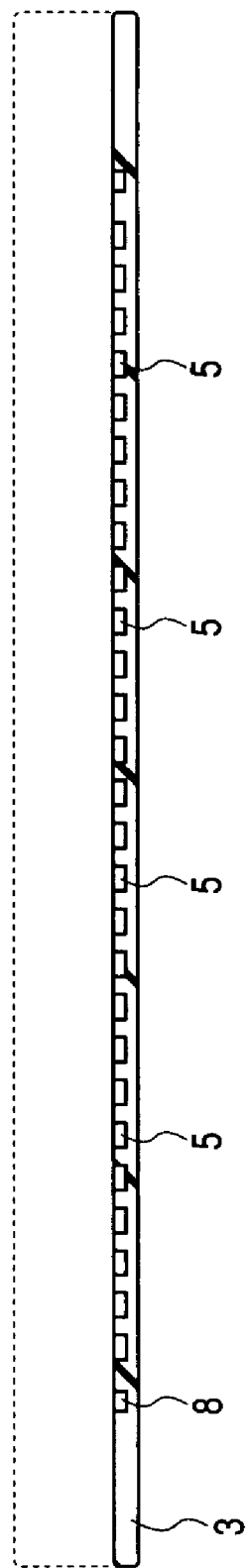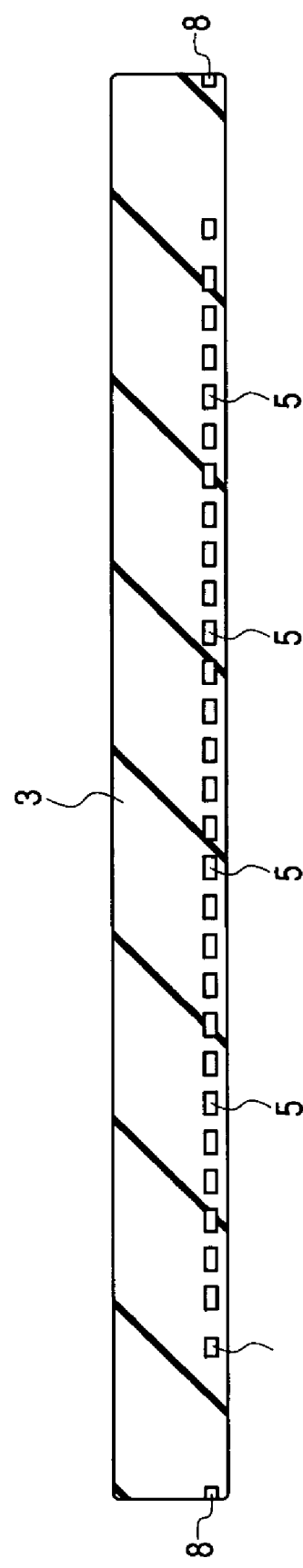

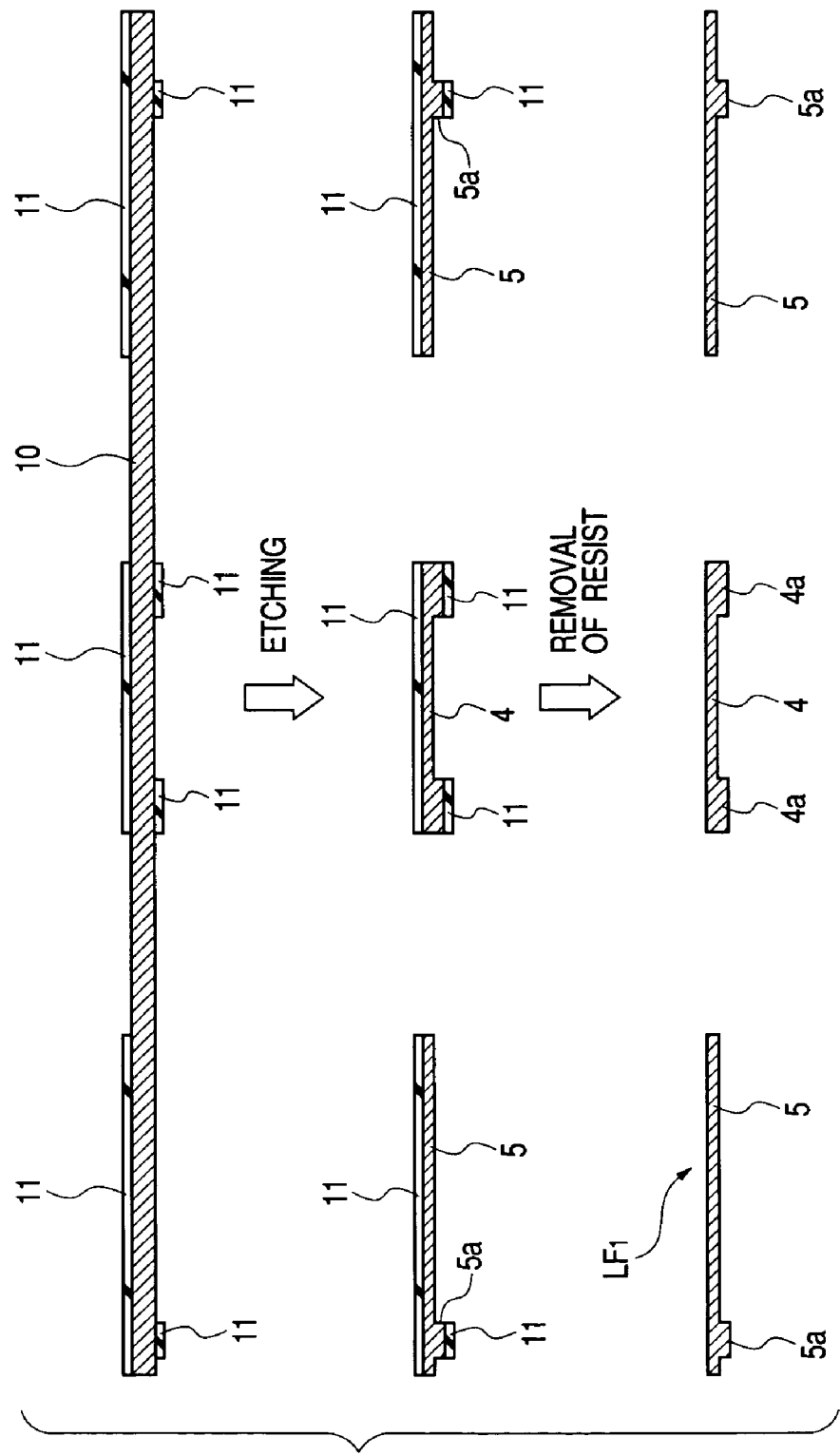

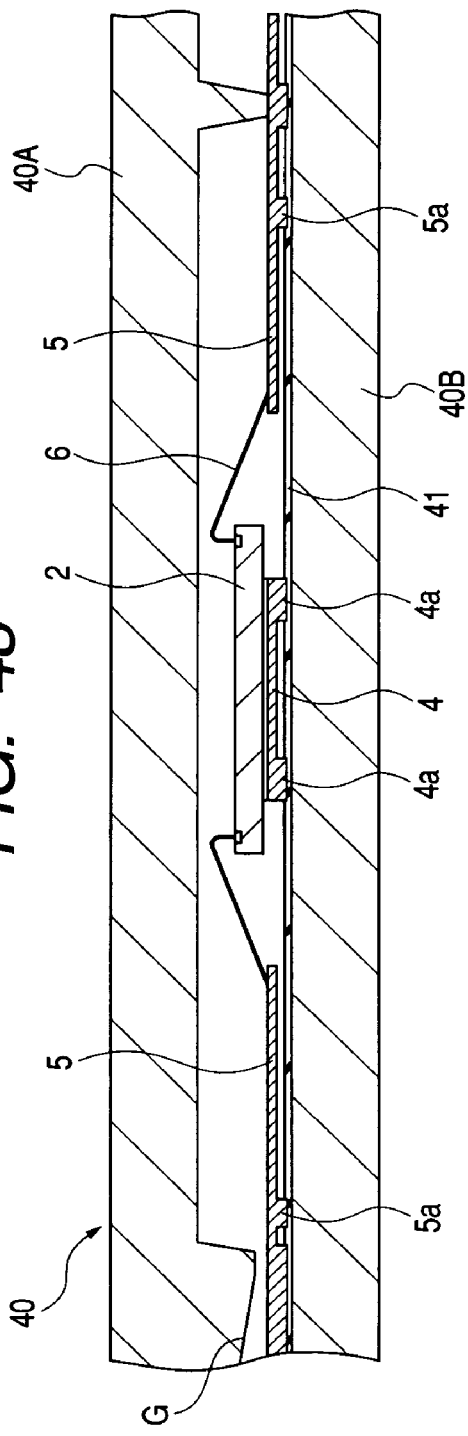
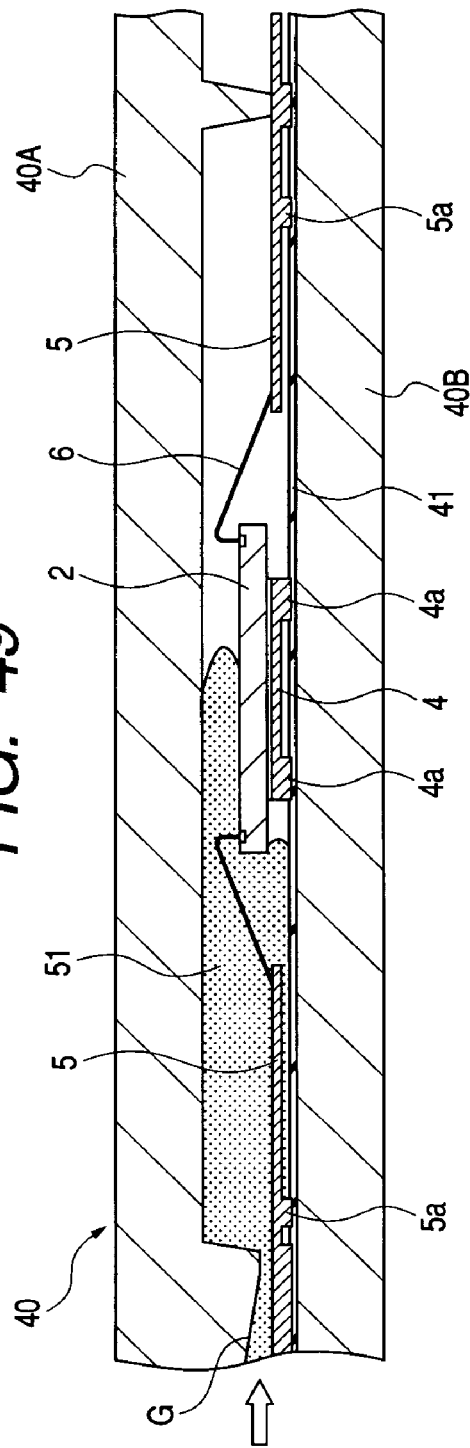

SEMICONDUCTOR DEVICE

BACKGROUND OF THE INVENTION

The present invention relates to a semiconductor device and a method of manufacturing the same. Particularly, the present invention is concerned with a technique which is effectively applicable to a resin-sealed type semiconductor device.

As a resin package wherein a semiconductor chip mounted on a lead frame is sealed with a sealing member of a molded resin there is known a QFN (Quad Flat Non-leaded package) (see, for example, Patent Literatures 1 and 2).

The QFN is of a structure wherein one ends of plural leads which are electrically connected to a semiconductor chip through bonding wires are exposed from a back surface (underside) of an outer peripheral portion of a sealing member to constitute terminals, and bonding wires are connected to the surfaces opposite to the exposed surfaces of the terminals, i.e., to terminal surfaces in the interior of the sealing member, to connect the terminals and the semiconductor chip electrically with each other. By soldering these terminals to electrodes (foot print) of a wiring substrate, the semiconductor chip is mounted. This structure is advantageous in that the packaging area is smaller than that in a QFP (Quad Flat Package) wherein leads extend laterally from side faces of a package (a sealing member) to constitute terminals.

[Patent Literature 1]

Japanese Unexamined Patent Publication No. 2001-189410

[Patent Literature 2]

Japanese Patent No. 3072291

SUMMARY OF THE INVENTION

In the above QFN manufacturing process, a semiconductor chip is mounted on a die pad portion of a lead frame, the semiconductor chip and leads are connected with each other using wires, then the lead frame is loaded into a molding die to seal the semiconductor chip with resin, and thereafter unnecessary portions of the lead frame exposed to the exterior of the resin sealing member are cut off with a dicer. At this time, metallic burrs occur in the cut faces of the leads, causing a lowering in the production yield of QFN. If the lead frame dicing speed with the dicer is set low, the occurrence of metallic burrs will be decreased, but the productivity of QFN is deteriorated because the lead frame dicing work consumes much time.

Further, in the lead frame referred to above, lead patterns are formed by etching or pressing a metallic sheet, so if an attempt is made to attain a multi-pin structure of QFN and narrow the lead pitch, it is necessary to thin the metallic sheet used in fabricating the lead frame. As a result, leads and suspension leads become less rigid and a positional deviation of the semiconductor chip becomes easy to occur due to flowing of molten resin at the time of sealing the semiconductor chip with resin.

It is an object of the present invention to provide a technique for improving the production yield of QFN.

It is another object of the present invention to provide a technique capable of promoting a multi-pin structure of QFN.

The above and other objects and novel features of the present invention will become apparent from the following description and the accompanying drawings.

Typical modes of the invention disclosed herein will be outlined below.

A semiconductor device according to the present invention comprises a semiconductor chip, a plurality of leads arranged around the semiconductor chip, terminals connected to the plural leads respectively, a plurality of wires for connecting the semiconductor chip and the plural leads electrically with each other, and a resin sealing member for sealing the semiconductor chip, the plural leads and the plural wires, the terminals connected respectively to the plural leads being exposed to the exterior from a back surface of the sealing member, wherein one ends of the plural leads are exposed to the exterior from side faces of the resin sealing member and are covered throughout the whole peripheries thereof with resin which constitutes the resin sealing member.

A semiconductor device manufacturing method according to the present invention comprises the steps of:

(a) providing a lead frame formed with plural patterns each including the die pad portion and the plural leads;

(b) mounting a semiconductor chip on the die pad portion formed on the lead frame and connecting the semiconductor chip and the plural leads with each other through wires;

(c) thereafter, sandwiching the lead frame between an upper die half and a lower die half and injecting resin into plural cavities formed between the upper and lower die halves to form a plurality of resin sealing members; and (d) thereafter, cutting the lead frame with a dicer to divide the plural resin sealing members into individual pieces;

wherein, at the time of cutting the lead frame with the dicer in the step (d), peripheral portions of the plural resin sealing members are each cut with the dicer to cover the whole peripheries of one end portions of the plural leads with the resin which constitute the resin sealing members, the plural leads being exposed to the cut faces of the resin sealing members.

BRIEF DESCRIPTION OF THE DRAWINGS

FIG. 30 is a sectional view of the resin sealing member taken along a conventional cutting line;

FIG. 31 is a sectional view of the resin sealing member taken along a cutting line;

FIG. 47 is an explanatory diagram showing how to fabricate the lead frame illustrated in FIGS. 44 and 45;

FIG. 48 is a sectional view of a principal portion of the lead frame and a molding die, showing how to manufacture the semiconductor device of the third embodiment;

FIG. 49 is a sectional view of a principal portion of the lead frame and the molding die, showing how to manufacture the semiconductor device of the third embodiment;

DETAILED DESCRIPTION OF THE PREFERRED EMBODIMENTS

Figure 1:
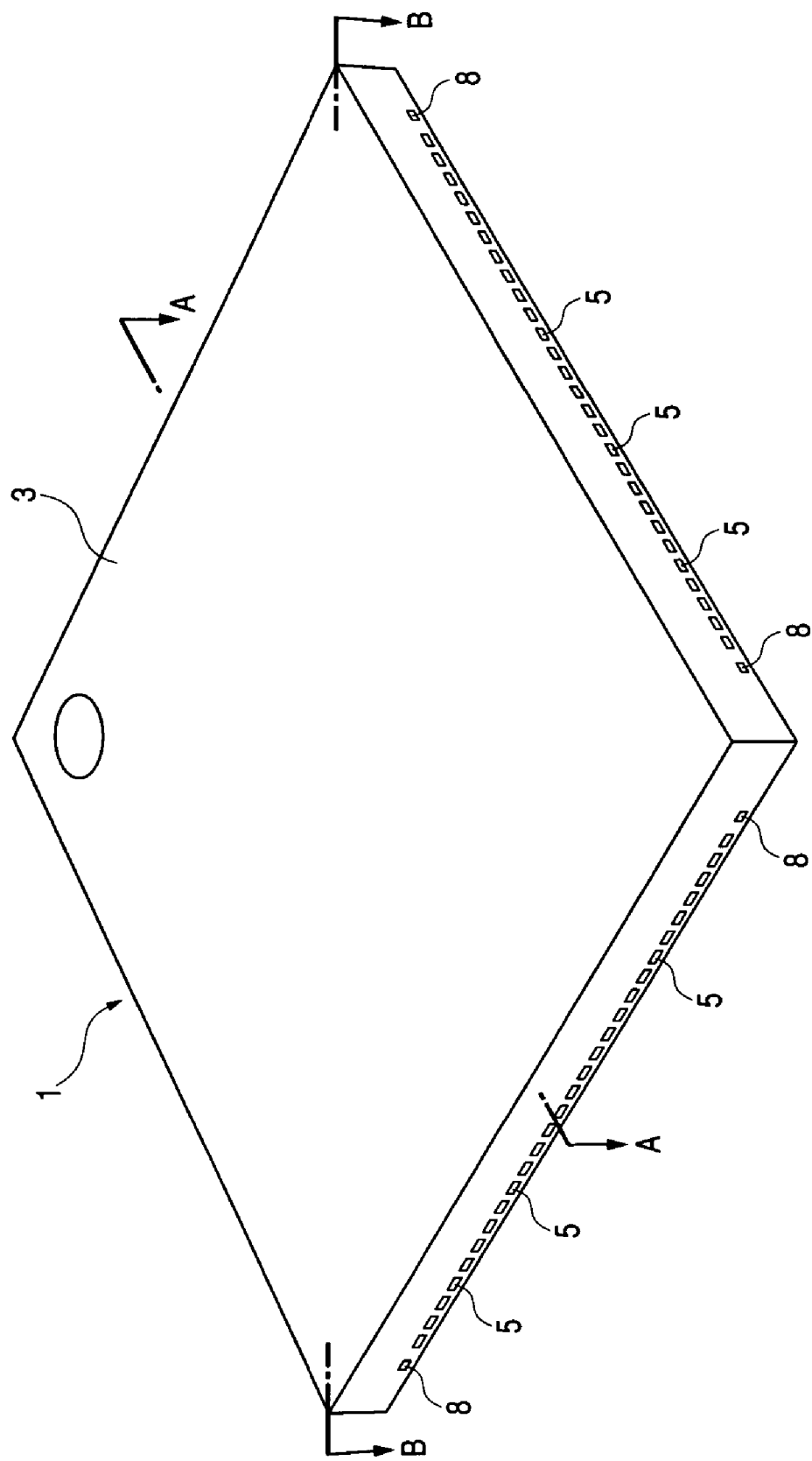
FIG. 1 is a perspective view showing an appearance of a semiconductor device according to a first embodiment of the present invention.

Embodiments of the present invention will be described in detail hereinunder with reference to the drawings. In all of the drawings for illustrating the embodiments, components having the same functions are identified by like reference numerals, and repeated explanations thereof will be omitted. Further, in the following embodiments, explanations of the same or similar portions will not be repeated in principle except where explanations are specially needed.

(First Embodiment)

Figure 2:
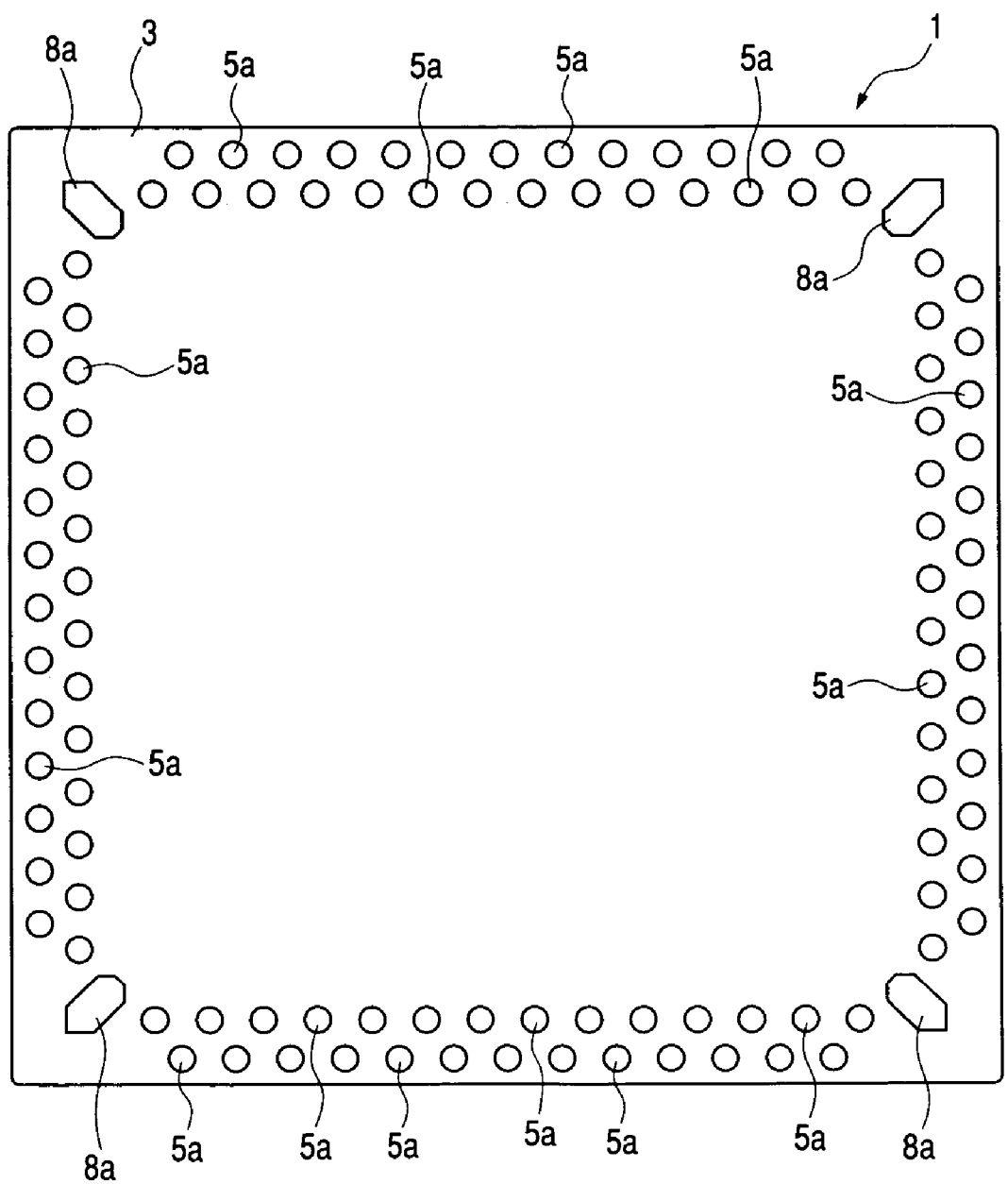
FIG. 2 is a plan view showing an appearance (back surface) of the semiconductor device of the first embodiment.
Figure 3:
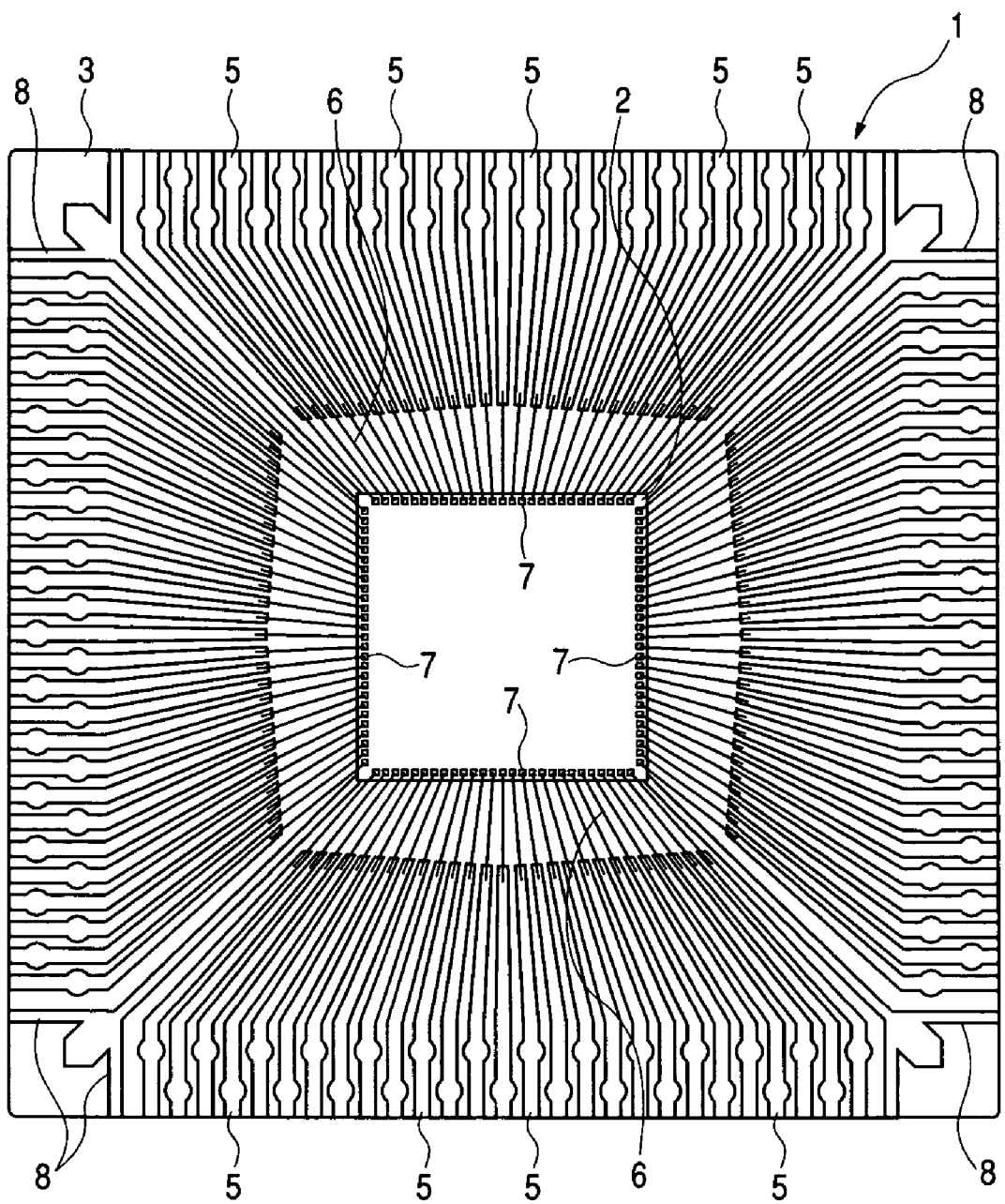
FIG. 3 is a plan view showing an internal structure (surface side) of the semiconductor device of the first embodiment.
Figure 4:
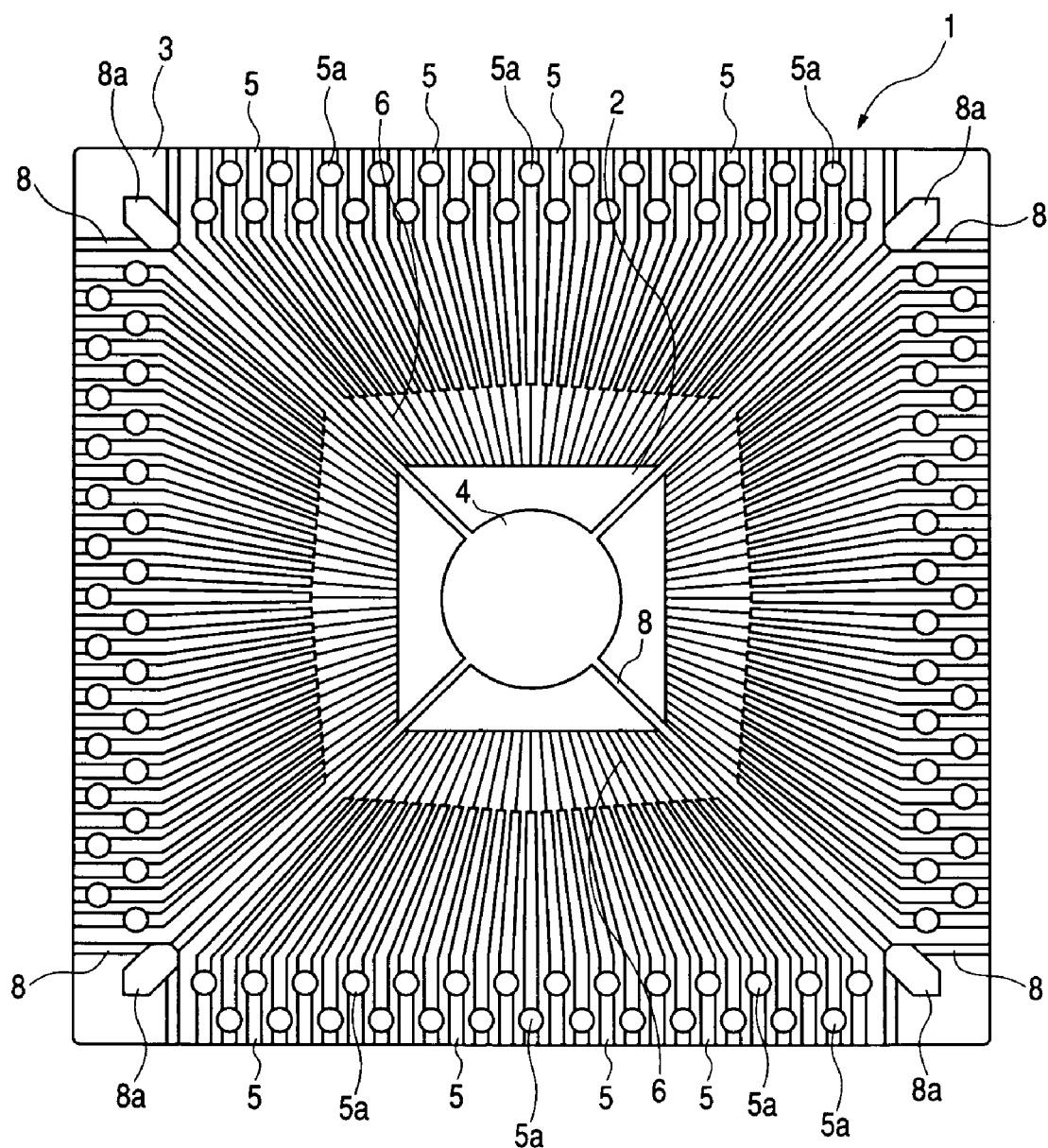
FIG. 4 is a plan view showing an internal structure (back surface) of the semiconductor device of the first embodiment.
Figure 5:
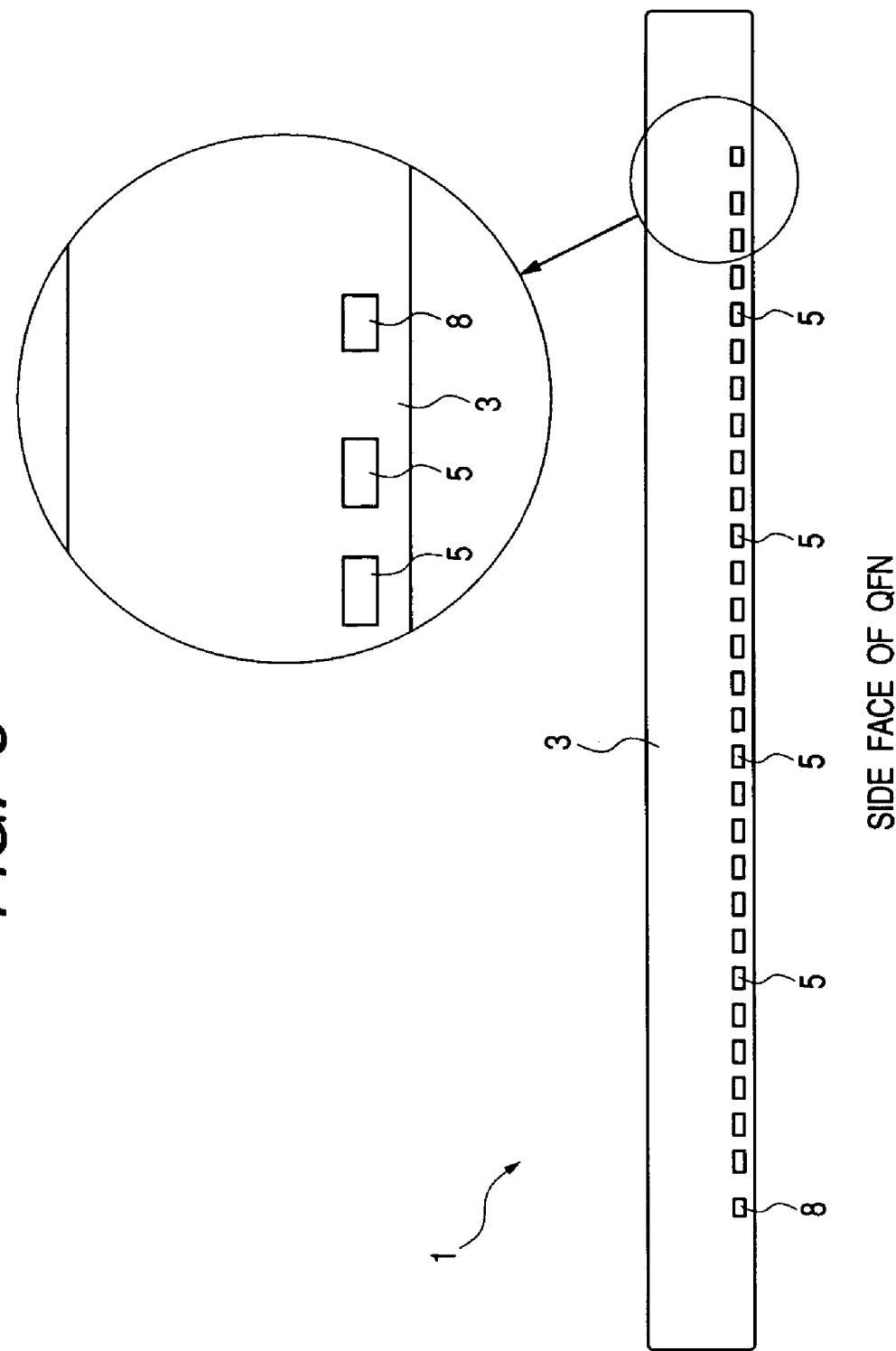
FIG. 5 is a side view of the semiconductor device of the first embodiment.
Figure 6:
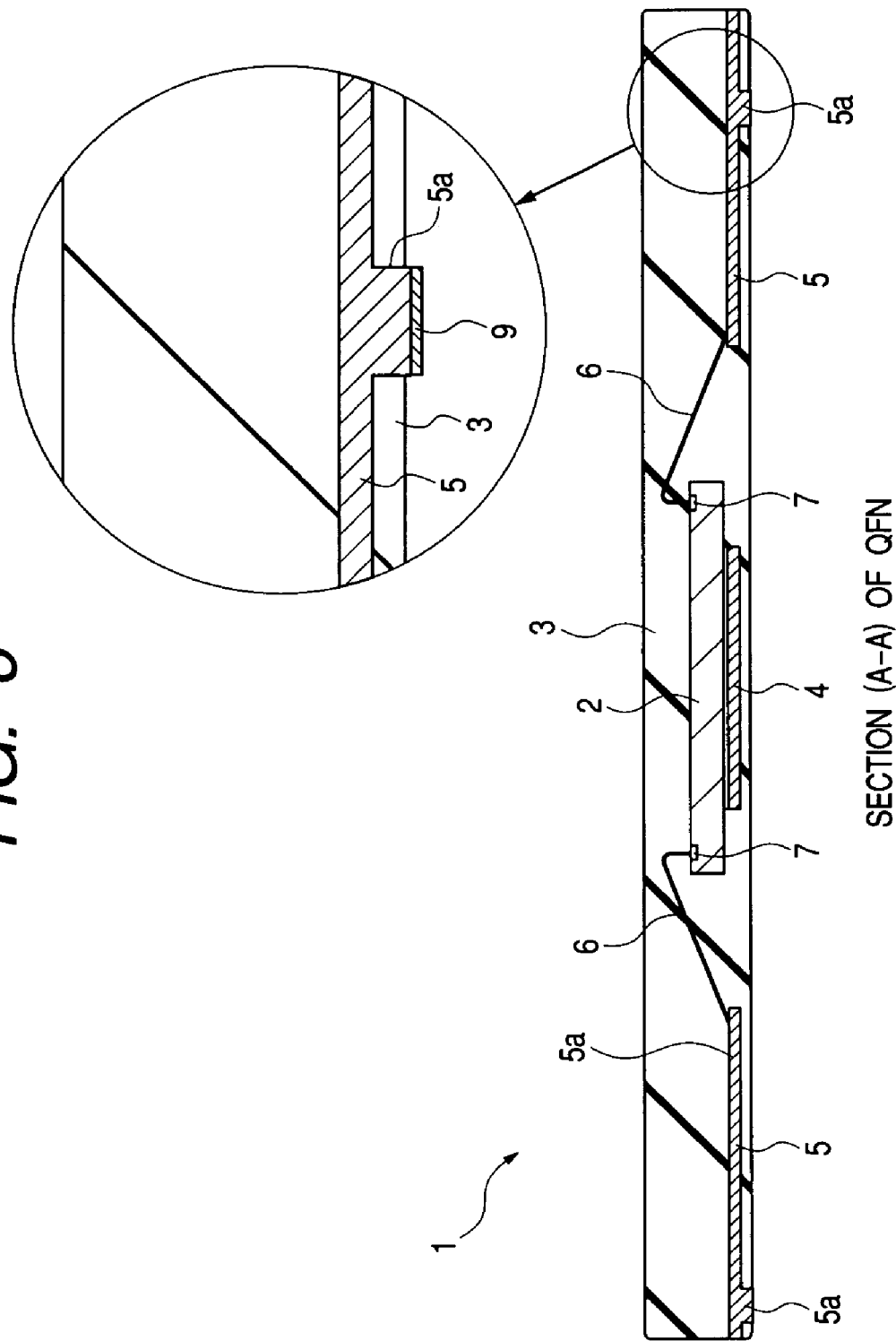
FIG. 6 is a sectional view of the semiconductor device taken along line A—A in FIG. 1.
Figure 7:
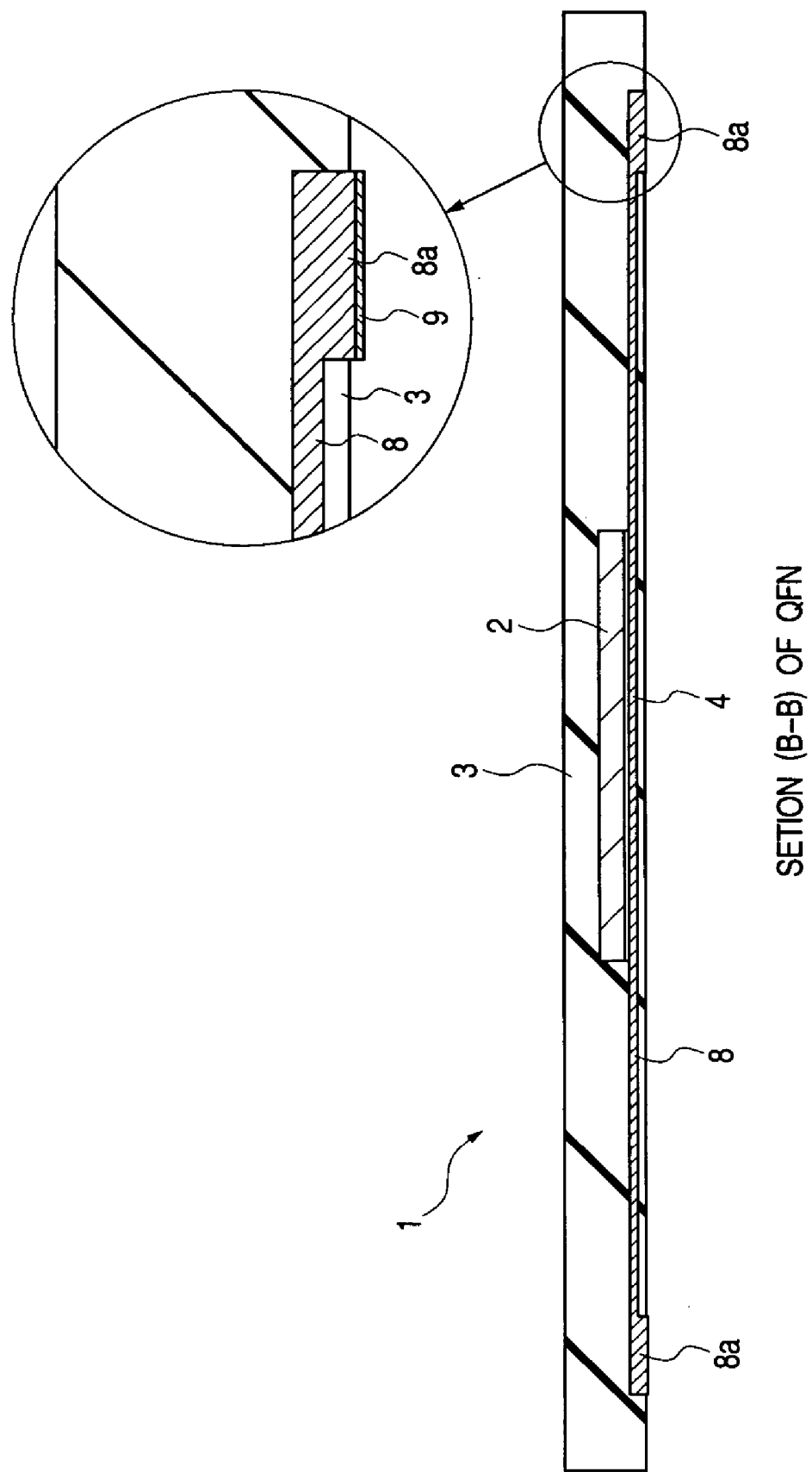
FIG. 7 is a sectional view of the semiconductor device taken along line B—B in FIG. 1.

FIG. 1 is a perspective view showing an appearance of a QFN according to an embodiment of the present invention, FIG. 2 is a plan view showing an appearance (back surface) of the QFN, FIG. 3 is a plan view showing an internal structure (surface side) of the QFN, FIG. 4 is a plan view showing an internal structure (back surface) of the QFN, FIG. 5 is a side view of the QFN, FIG. 6 is a sectional view taken along line A—A in FIG. 1, and FIG. 7 is a sectional view taken along line B—B in FIG. 1.

The QFN of this embodiment, indicated at 1, is a surface-mounted type package wherein one semiconductor chip 2 is sealed with a resin sealing member 3. It external dimensions are, for example, 12 mm long, 12 mm wide, and 1.0 mm thick.

A semiconductor chip 2 is mounted on an upper surface of a metallic die pad portion 4 and in this state is disposed at a center of a resin sealing member 3. The die pad portion 4 is formed as a so-called small tab structure wherein its diameter is set smaller than the diameter of the semiconductor chip 2 so as to permit mounting thereon of plural types of semiconductor chips 2 ranging in one-side length from, for example, 4 to 7 mm.

The die pad portion 4 is supported by four suspension leads 8 extending toward corners of the resin sealing member 3. As shown in FIGS. 3 and 4, front ends of each of the four suspension leads 8 are bifurcated near a corner of the resin sealing member 3 and the bifurcated portions are terminated at side faces of the resin sealing member 3.

Plural (for example, 116) leads 5 are arranged at approximately equal intervals around the die pad portion 4 with the semiconductor chip 2 mounted thereon. One ends (close to the semiconductor chip 2) of the leads 5 are electrically connected through Au wires 6 to bonding pads 7 formed on a main surface of the semiconductor chip 2, while opposite ends thereof are terminated at side faces of the resin sealing member 3. In order to shorten the distance from the semiconductor chip 2, one ends (close to the semiconductor chip 2) of the leads 5 are extended to near the die pad portion 4. The leads 5 are formed of the same metal as that of the die pad portion 4 and the suspension leads 8 and the thickness thereof is, for example, 65 to 75 μm.

As shown in FIGS. 1 and 5, the opposite ends of the leads 5 and the front ends of the suspension leads 8 are exposed to outer side faces of the resin sealing member 3. The opposite ends of the leads 5 and the front ends of the suspension leads 8, which are exposed to side faces of the resin sealing member 3 are covered throughout the respective whole peripheries (upper and lower surfaces and both side faces) with the resin which constitute the resin sealing member 3.

As will be described later, the QFN 1 is fabricated by resin-molding the semiconductor chip 2, die pad portion 4, leads 5 and suspension leads 8 to form the resin sealing member 3 and by cutting the leads 5 and suspension leads 8 exposed to the exterior of the resin sealing member 3 with use of a dicer. At the time of cutting the leads 5 and the suspension leads 8 by the dicer, if the cutting is performed in such a manner that the opposite ends of the leads 5 and the front ends of the suspension leads 8 are covered with resin throughout the respective whole peripheries, it is possible to prevent the formation of metallic burrs at the cut faces of the leads and the suspension leads 8.

As shown in FIG. 2, plural (for example, 116) external connecting terminals 5a are formed on a back surface (substrate mounting surface) of the resin sealing member 3. The terminals 5a are arranged zigzag in two rows along each side of the resin sealing member 3. Surfaces of the terminals 5a are projecting to the outside from the back surface of the resin sealing member 3. The terminals 5a, which are integral with the leads 5, are approximately twice (125 to 150 μm) as thick as the leads 5.

On the back surface of the resin sealing member 3 there are formed four projections 8a. The projections 8a are arranged near the corners of the resin sealing member 3 and their surfaces are projecting to the outside from the back surface of the resin sealing member 3. The projections 8a, which are integral with the suspension leads 8, are approximately twice (125 to 150 μm) as thick as the suspension leads 8, i.e., equal to the thickness of each terminal 5a.

As shown in FIGS. 6 and 7, the surfaces of the terminals 5a and projections 8a projecting outside the resin sealing member 3 are each covered with a solder layer 9 by, for example, soldering or printing. The QFN 1 is mounted by connecting the surfaces of the terminals 5a with electrodes (foot print) on a wiring substrate electrically through the solder layers 9. At this time, by bonding the surfaces of the projections 8a to the wiring substrate through the solder layers 9, it is possible to enhance the reliability of connection between the QFN 1 and the wiring substrate.

Figure 8:
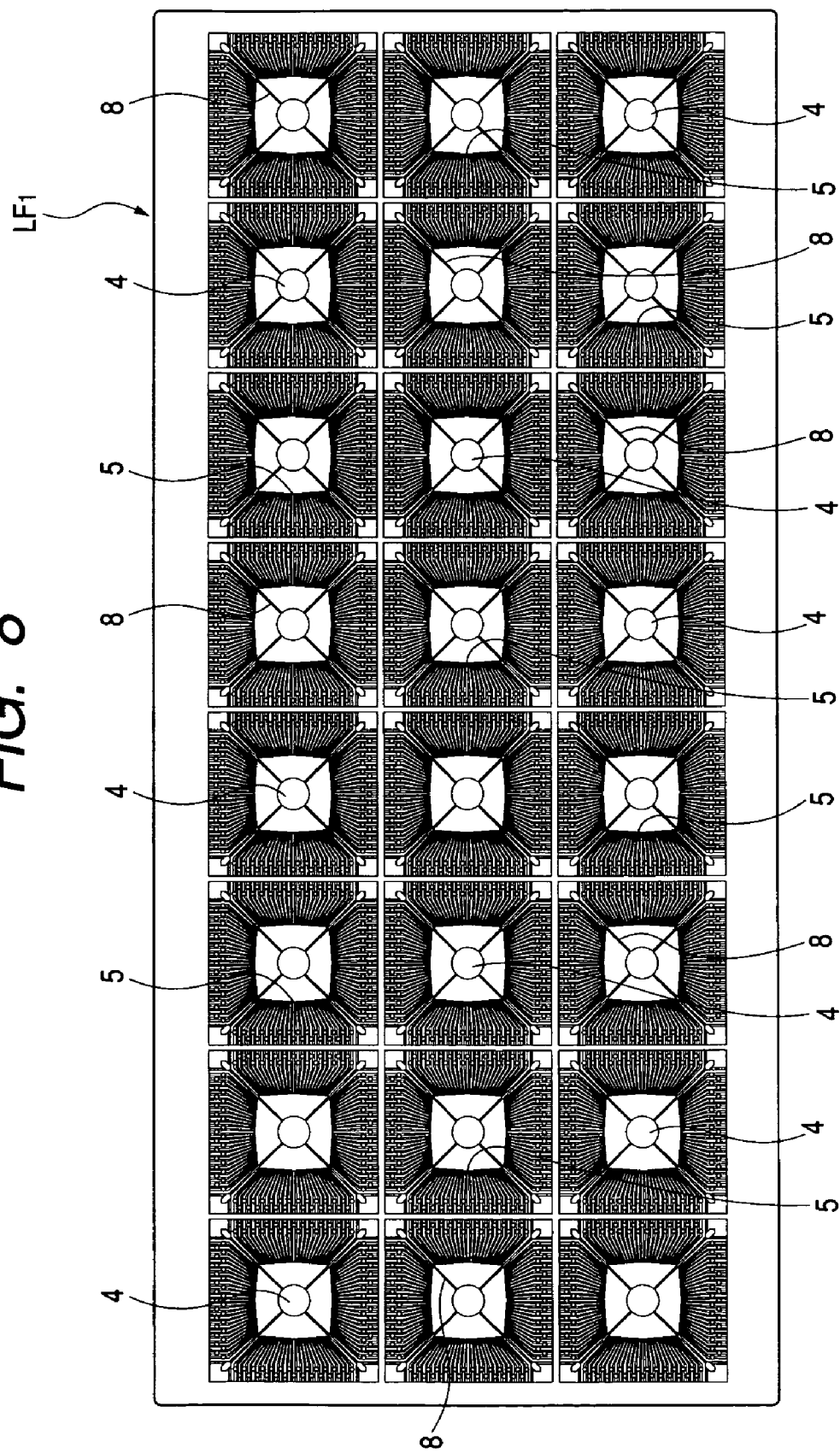
FIG. 8 is a plan view of a lead frame used in manufacturing the semiconductor device of the first embodiment.

A description will now be given about a method of manufacturing the QFN 1. First, there is provided such a lead frame $LF_1$ as shown in FIG. 8. The lead frame $LF_1$ is constituted by a metallic sheet of, for example, Cu, Cu alloy, or Fe—Ni alloy. On the lead frame $LF_1$ there are formed patterns of the die pad portion 4, leads 5, and suspension leads 8 repeatedly in both longitudinal and transverse directions. That is, the lead frame $LF_1$ has a multi-chip structure carrying plural (for example, 24) semiconductor chips 2 thereon.

Figure 9:
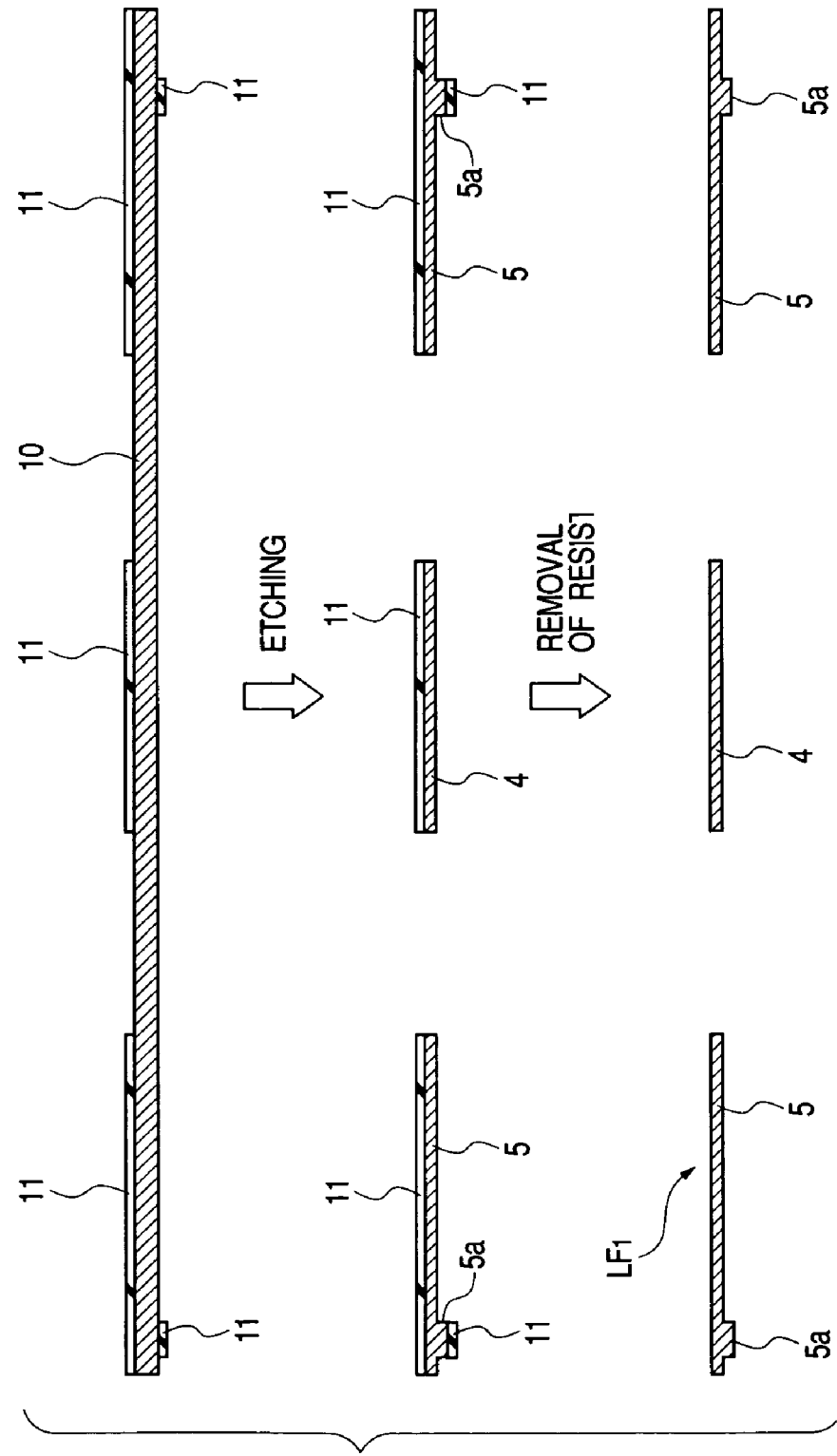
FIG. 9 is a sectional view of a principal portion, showing how to fabricate the lead frame illustrated in FIG. 8.
Figure 10:
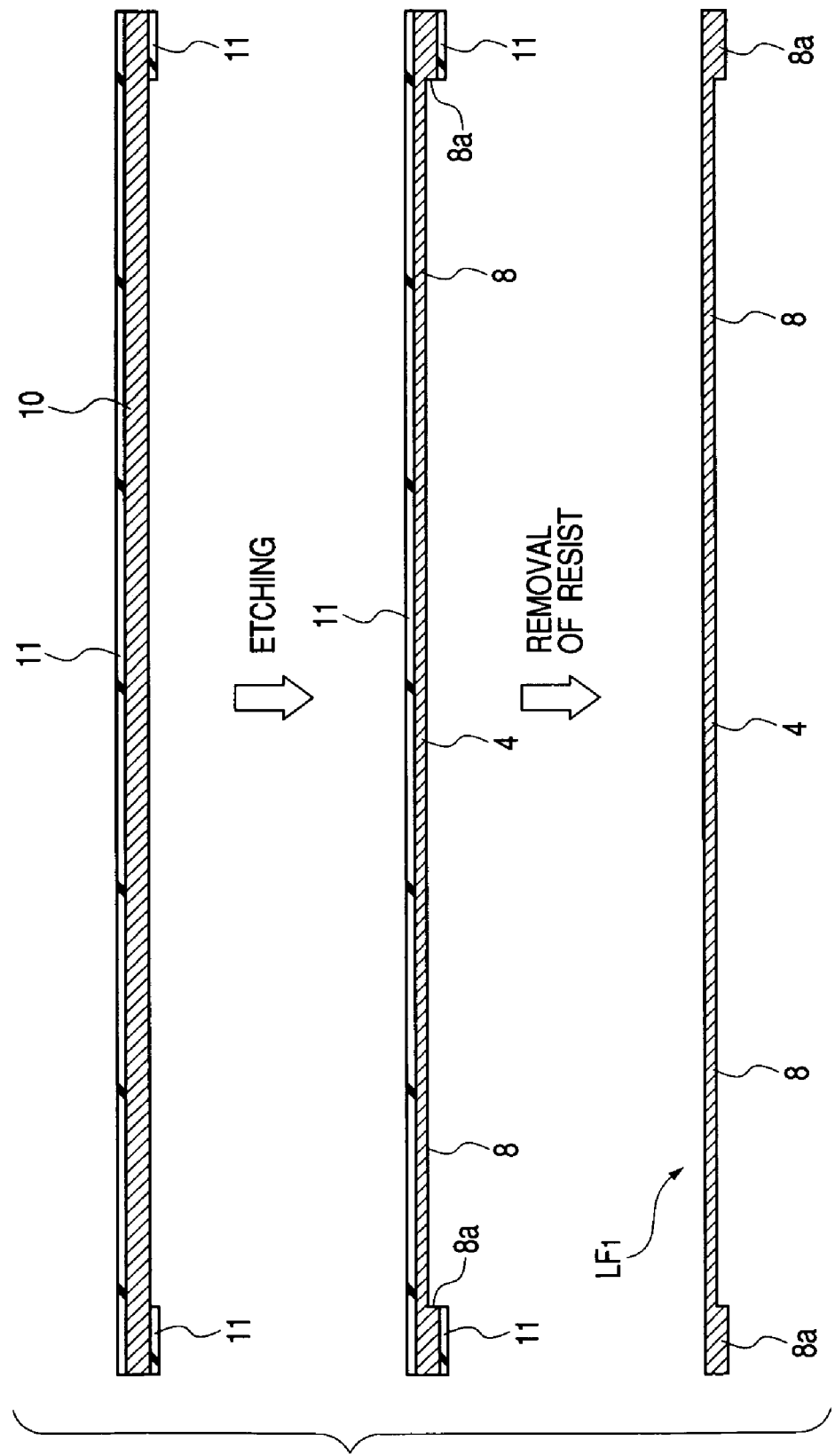
FIG. 10 is a sectional view of a principal portion, showing how to fabricate the lead frame illustrated in FIG. 8.

For fabricating the lead frame $LF_1$, as shown in FIGS. 9 and 10, there is provided a metallic sheet of, for example, Cu, Cu alloy, or Fe—Ni alloy, having a thickness of 125 to 150 μm and one side of the metallic sheet 10 is coated with a photoresist film 11 at positions where a die pad portion 4, leads 5 and suspension leads 8 are to be formed. Likewise, at positions where the external connecting terminals 5a and projections 8a are to be formed, both sides of the metallic sheet 10 are coated with the photoresist film 11. Then, in this state, the metallic sheet 10 is etched (half etching) using a medical liquid to thin the metallic sheet to about half (65 to 75 μm) in one-side regions coated with the photoresist film 11. If etching is performed by such a method, the metallic sheet 10 is removed completely in its regions not coated with the photoresist film 11 on both sides thereof, while a die pad portion 4, leads 5 and suspension leads 8, having a thickness of 65 to 75 μm, are formed in the regions coated with the photoresist film 11 on only one side. As to the metallic sheet 10 in the regions coated with the photoresist film 11 on both sides, it is not etched with the medical liquid, so that there are formed terminals 5a and projections 8a of the same thickness (125 to 150 μm) as the metallic sheet 10 prior to etching.

Figure 11:
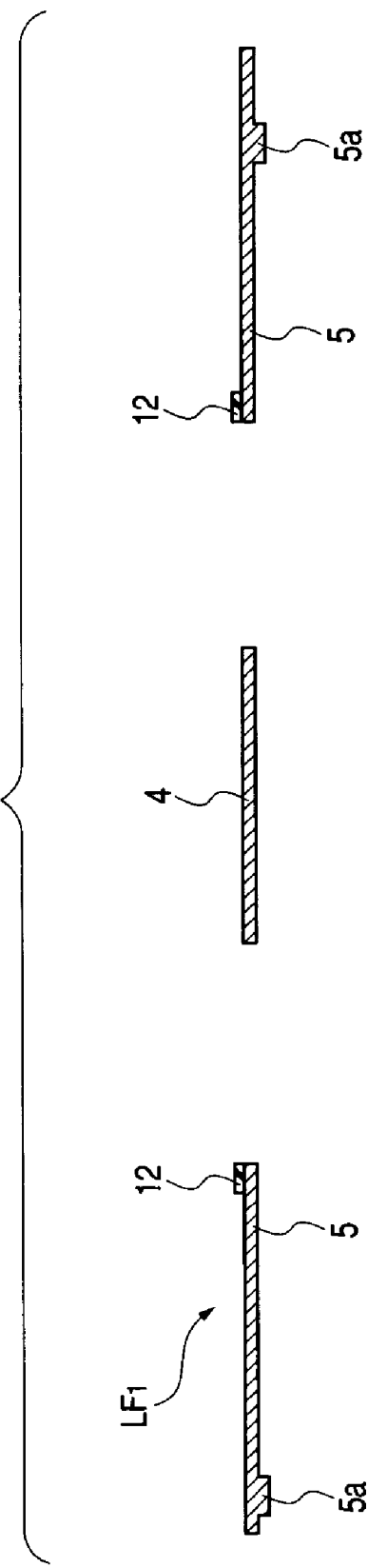
FIG. 11 is a sectional view of a principal portion, showing how to fabricate the lead frame illustrated in FIG. 8.

Next, after removal of the photoresist film 11, as shown in FIG. 11, Ag plating 12 is applied to surfaces of one end sides of the leads 5 to complete the lead frame $LF_1$ shown in FIG. 8. The means for applying Ag plating 12 to one end sides of the leads 5 may be substituted by applying Pd (palladium)

plating to the whole surface of the lead frame $LF_1$. Pd plating affords a thinner plating layer in comparison with Ag plating and therefore it is possible to improve the adhesion between leads 5 and Au wires 6. In case of applying Pd plating to the entire surface of the lead frame $LF_1$, plating layers are formed also on the surfaces of terminals 5a and projections 8a, so it is possible to omit the step of forming solder layers 9 on the surfaces of the terminals 5a and projections 8a.

Thus, by applying half etching to a part of the metallic sheet 10 serving as a base material of the lead frame $LF_1$ to thin the sheet thickness to half or so of the original thickness, it is possible to form thin die pad portion 4, leads 5 and suspension leads 8 and thick terminals 5a and projections 8a at a time.

Figure 12:
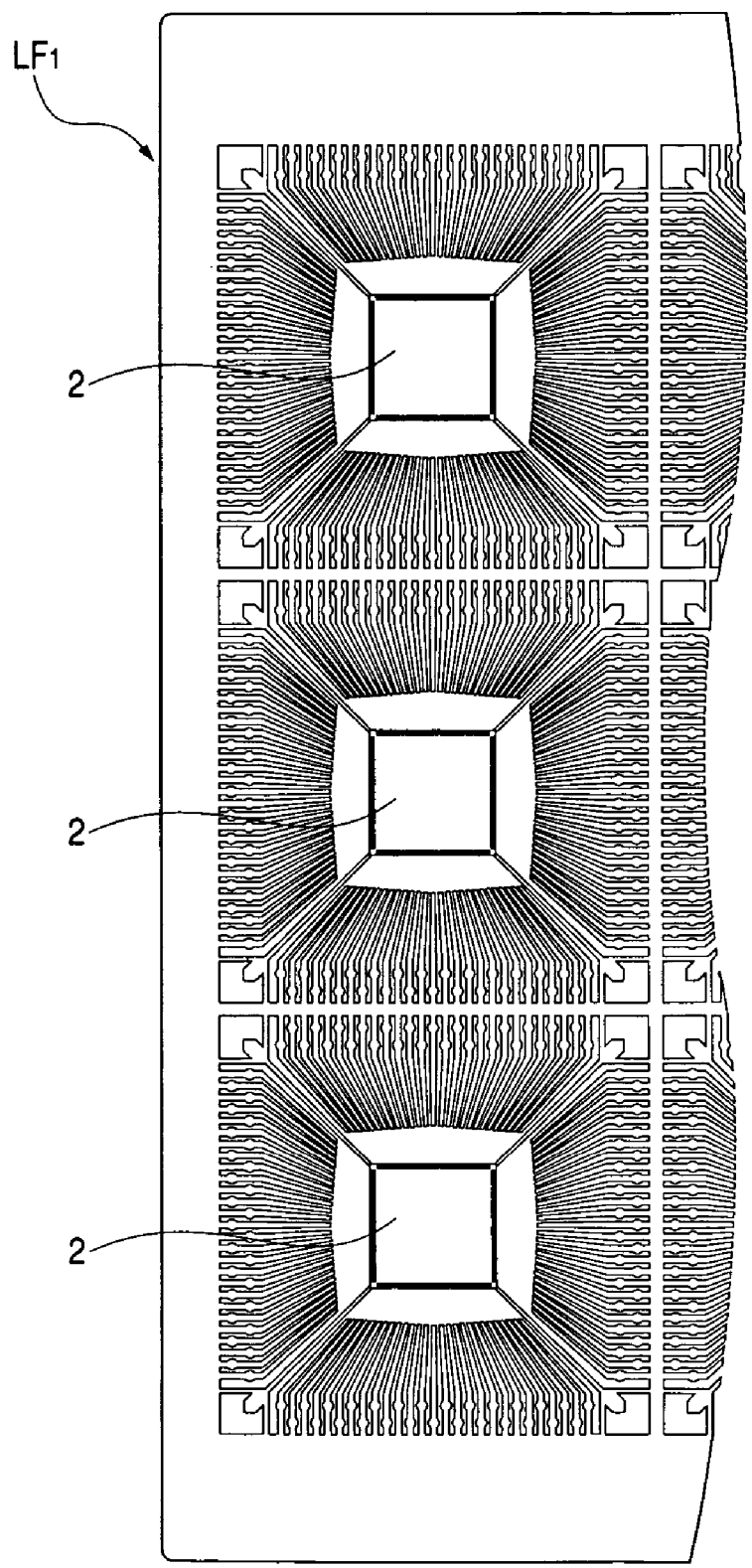
FIG. 12 is a plan view of a principal portion of the lead frame, showing how to manufacture the semiconductor device of the first embodiment.
Figure 13:
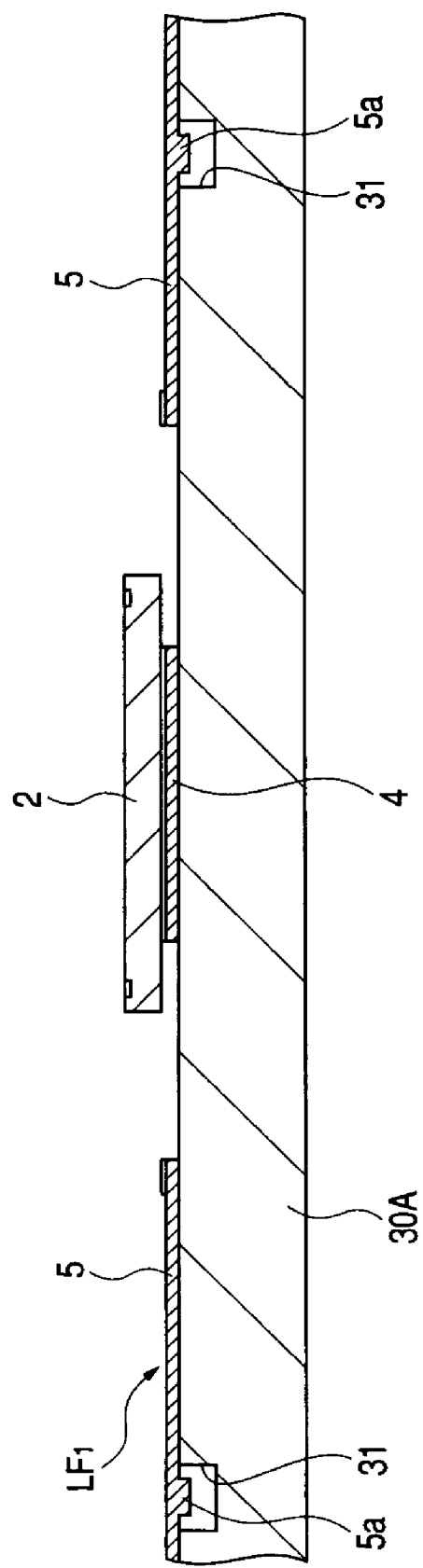
FIG. 13 is an explanatory diagram of a chip bonding step, showing how to manufacture the semiconductor device of the first embodiment.

For fabricating QFN 1 by using the lead frame $LF_1$, first, as shown in FIGS. 12 and 13, a semiconductor chip 2 is bonded onto the die pad portion 4 with use of an adhesive such as Au paste or an epoxy resin adhesive.

When conducting the above work, as shown in FIG. 13, since terminals 5a (and projections 8a not shown) are positioned on the back surface of the lead frame $LF_1$, it is preferable that grooves 31 be formed in a jig 30A which supports the lead frame $LF_1$ at positions opposed to the terminals 5a (and projections 8a). With the grooves 31, it is possible to support the lead frame $LF_1$ stably, so that it is possible to prevent deformation of the lead frame $LF_1$ and mutual positional deviations of the die pad portion 4 and the semiconductor chip 2 at the time of mounting the semiconductor chip 2 onto the die pad portion 4.

Figure 14:
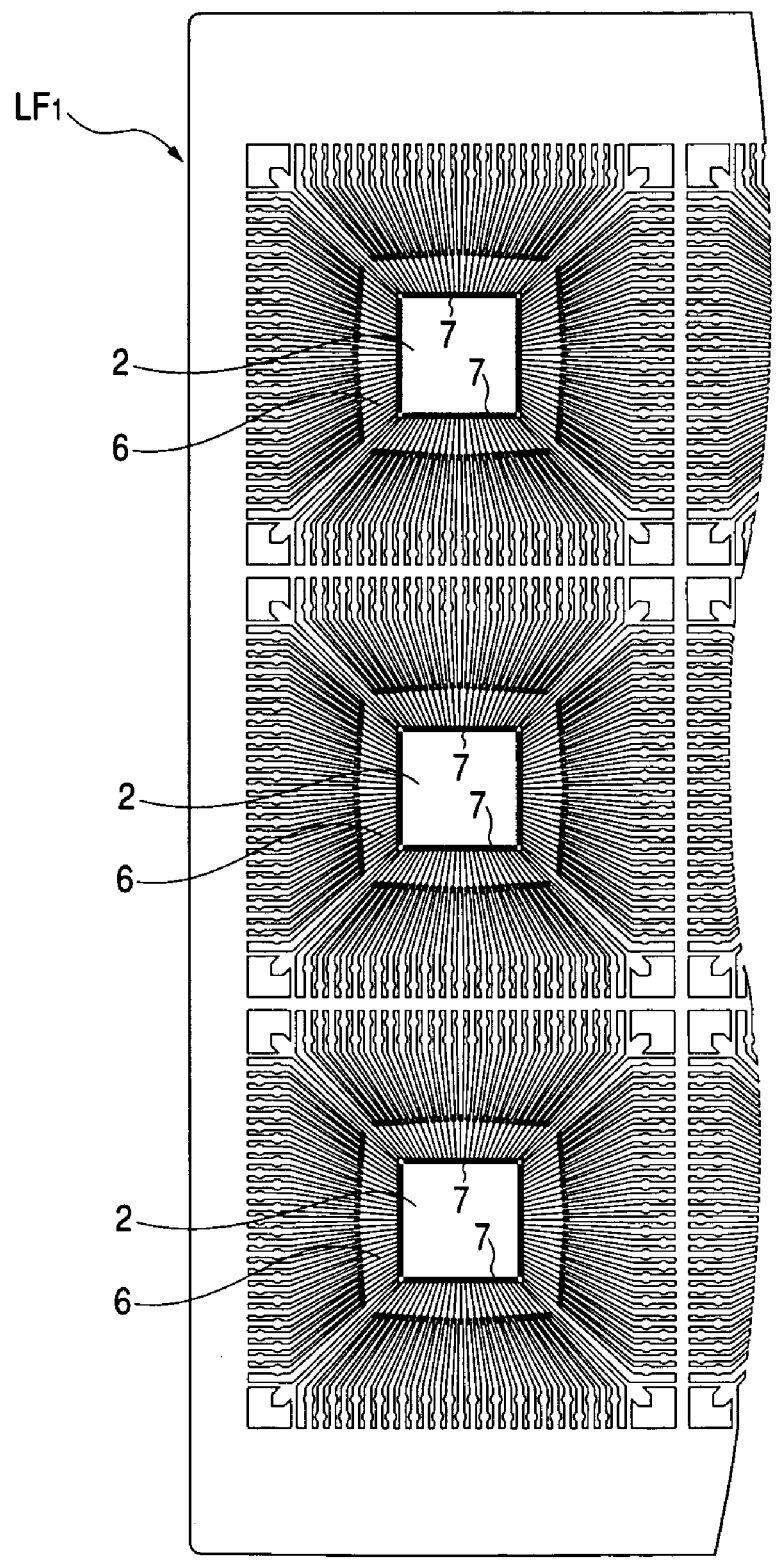
FIG. 14 is a plan view of a principal portion of the lead frame, showing how to manufacture the semiconductor device of the first embodiment.
Figure 15:
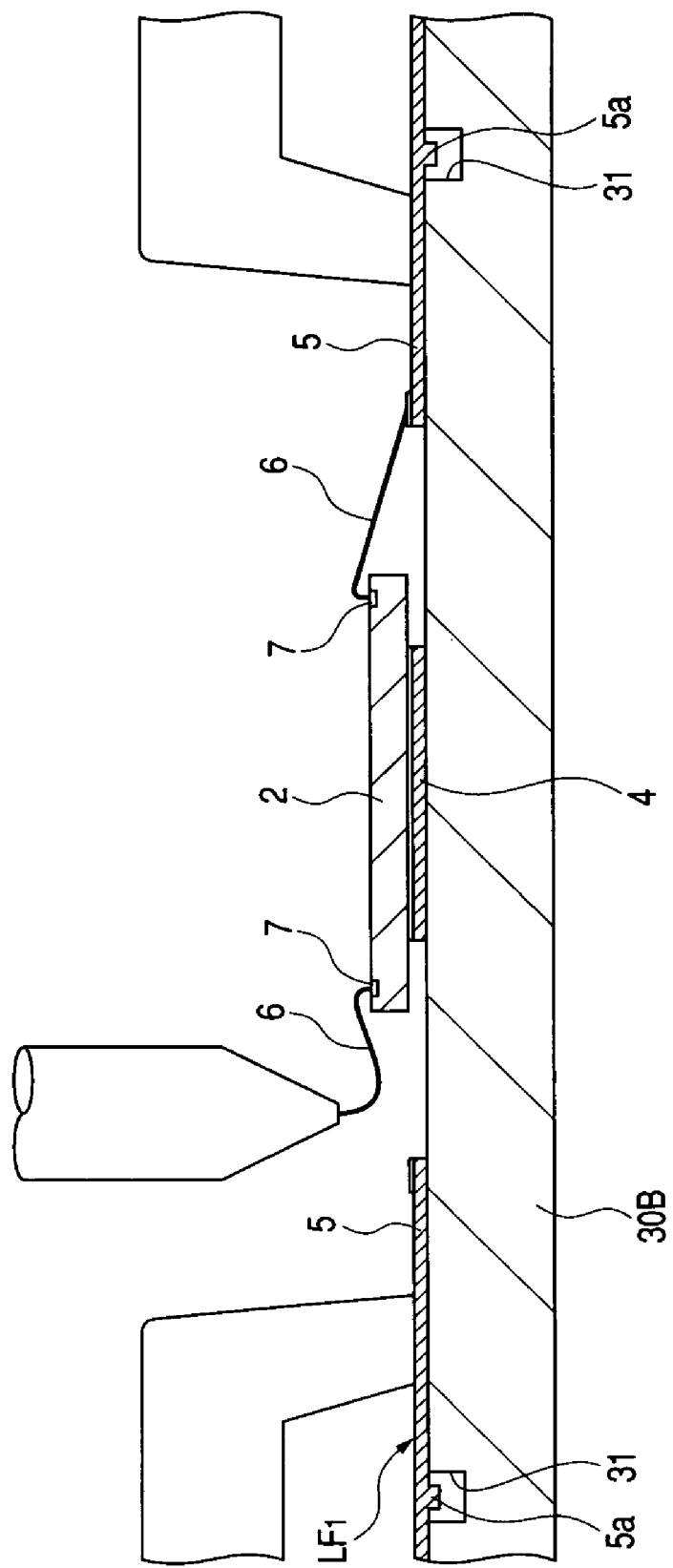
FIG. 15 is an explanatory diagram of a wire bonding step, showing how to manufacture the semiconductor device of the first embodiment.

Next, as shown in FIGS. 14 and 15, bonding pads 7 of the semiconductor chip 2 and one end sides of the leads 5 are connected together through Au wires 6 by means of a known ball bonder. Also in this case, as shown in FIG. 15, if grooves 31 are formed in a jig 30B which supports the lead frame $LF_1$ at positions corresponding to the terminals 5a, it is possible to support the lead frame $LF_1$ stably and hence possible to prevent mutual positional deviations of the Au wires 6 and the leads 5 and of the Au wires 6 and the bonding pad 7.

Figure 16:
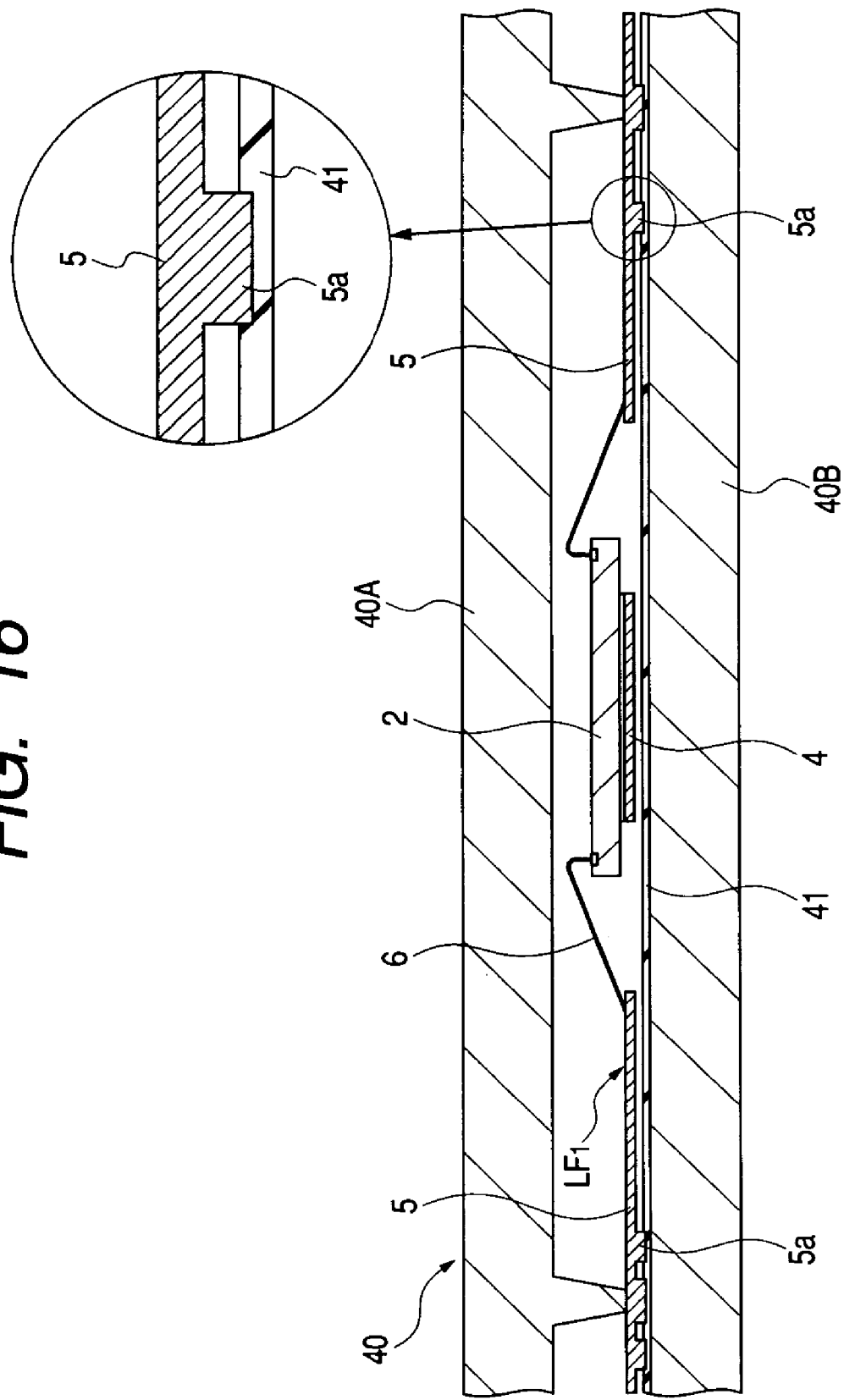
FIG. 16 is a sectional view of a principal portion of the lead frame and a molding die, showing how to manufacture the semiconductor device of the first embodiment.

Next, the lead frame $LF_1$ is loaded into a molding die 40 shown in FIG. 16 and the semiconductor chip 2 is sealed with resin. FIG. 16 is a sectional view showing a part (an area corresponding to approximately one QFN).

For sealing the semiconductor chip 2 with resin by using the molding die 40, first a thin resin sheet 41 is laid over a surface of a lower die half 40B and the lead frame $LF_1$ is placed on the resin sheet 41. In this case, the lead frame $LF_1$ is placed on the resin sheet in such a manner that its side with terminals 5a (and projections 8a not shown) formed thereon faces down, allowing the terminals 5a (and projections 8a) and the resin sheet 41 to be brought into contact with each other. In this state, the resin sheet 41 and the lead frame $LF_1$ are pinched by both upper die half 40A and lower die half 40B. By so doing, the terminals 5a (and projections 8a) positioned on the underside of the leads 5 hold down the resin sheet 41 under a pressing force of the molding die 40 (upper and lower die halves 40A, 40B), so that front end portions of the terminals (and projections 8a) bite into the resin sheet 41.

Figure 17:
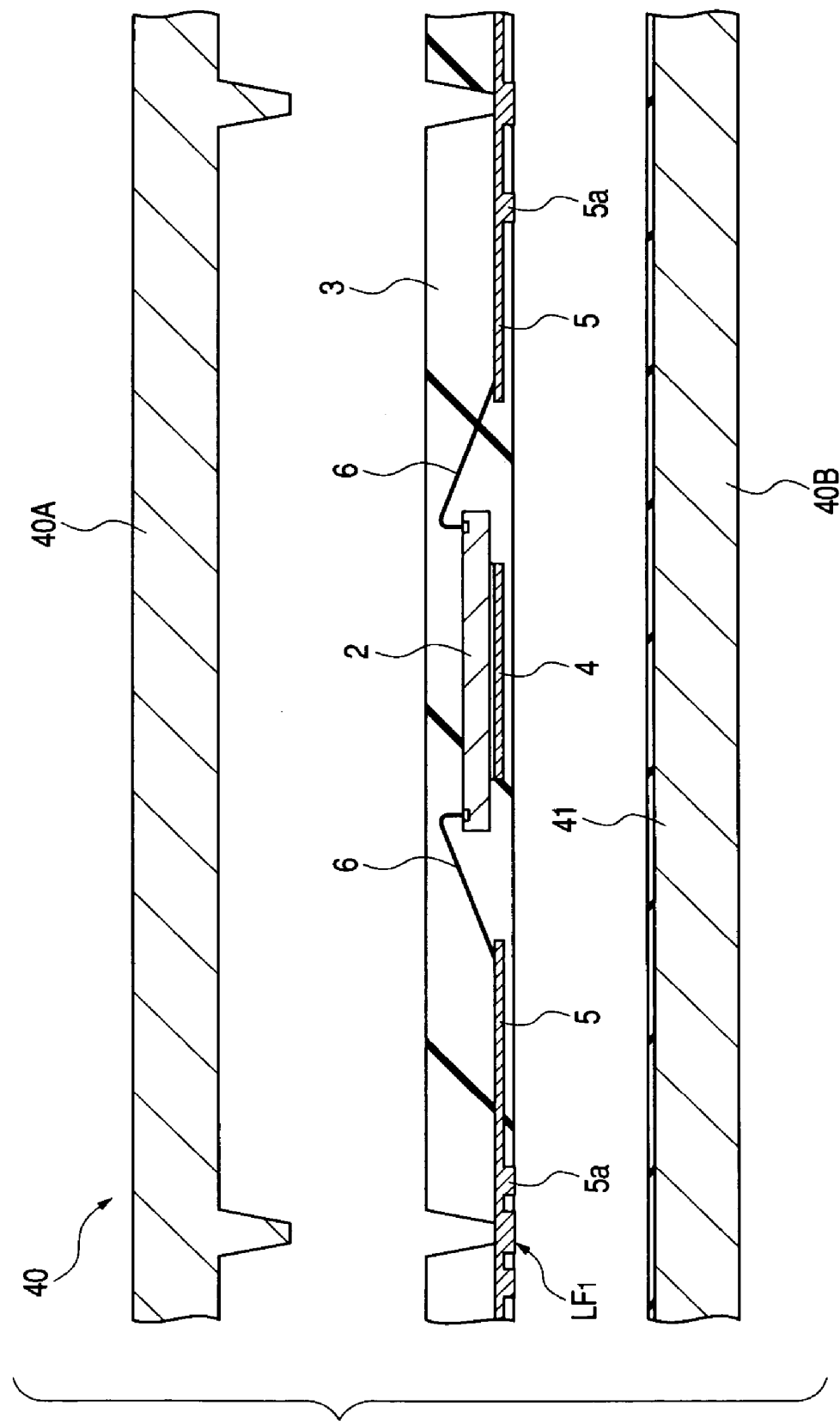
FIG. 17 is a sectional view of a principal portion of the lead frame and the molding die, showing how to manufacture the semiconductor device of the first embodiment.
Figure 18:
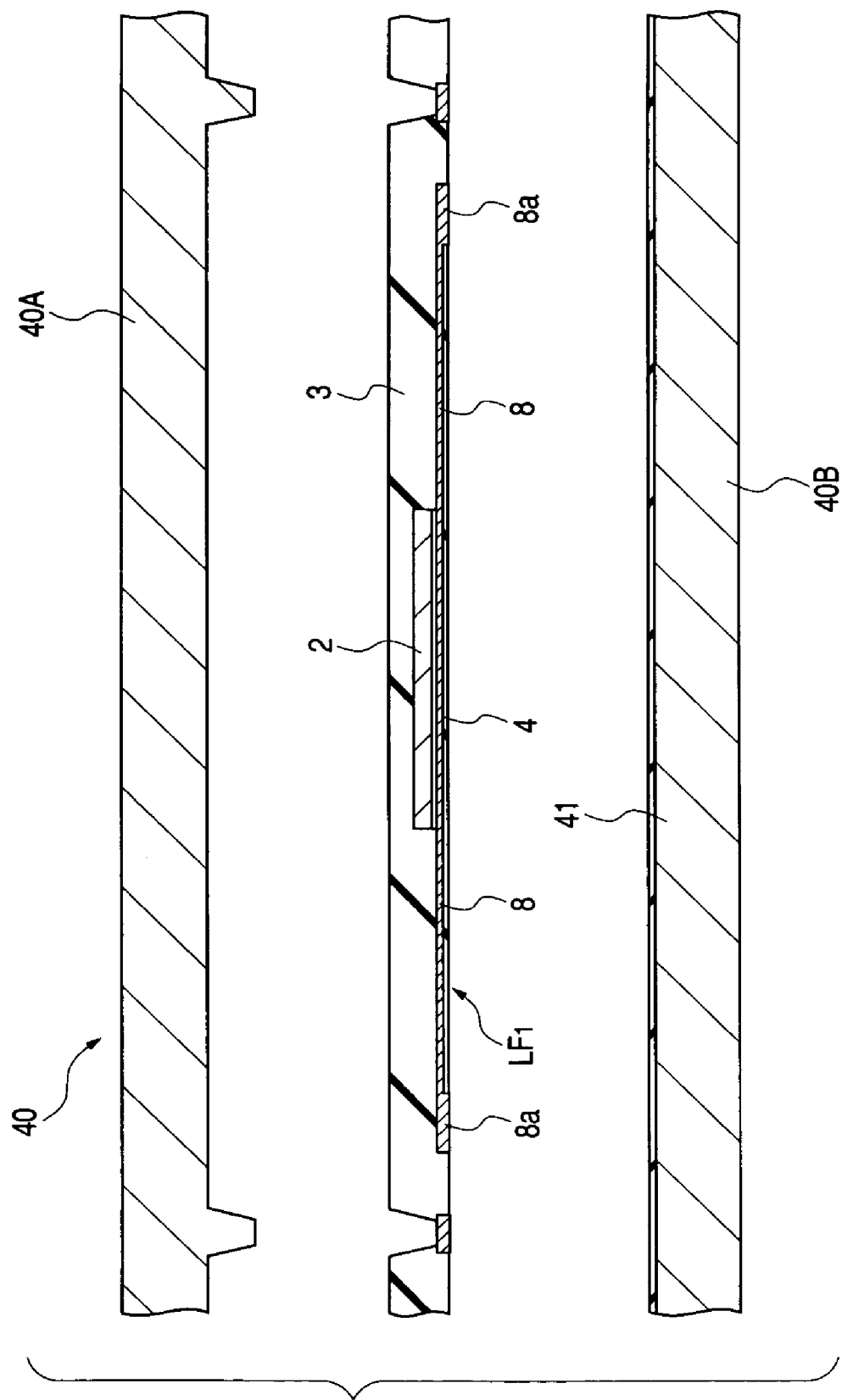
FIG. 18 is a sectional view of a principal portion of the lead frame and the molding die, showing how to manufacture the semiconductor device of the first embodiment.

As a result, if molten resin is injected into a gap (cavity) between the upper and lower die halves 40A, 40B to form the resin sealing member 3 and if both die halves are then separated from each other, the front end portions of the terminals 5a and projections 8a which have bitten into the resin sheet 41 project to the exterior from the back surface of the resin sealing member 3, as shown in FIGS. 17 and 18.

In the lead frame $LF_1$ used in this embodiment, as noted earlier, since patterns (die pad portion 4, leads 5, and suspension leads 8) are formed by half etching, the thickness of each lead 5 is as small as about half of the thickness in the conventional lead frame. Consequently, the pressing force of the molding die 40 (upper and lower die halves 40A, 40B) against the lead frame $LF_1$ is weaker than in the use of the conventional lead frame and therefore the pressing force of the terminals 5a and projections 8a against the resin sheet 41 becomes weak, resulting in that the projecting height of the resin sealing member 3 projecting to the exterior becomes smaller.

Figure 19:
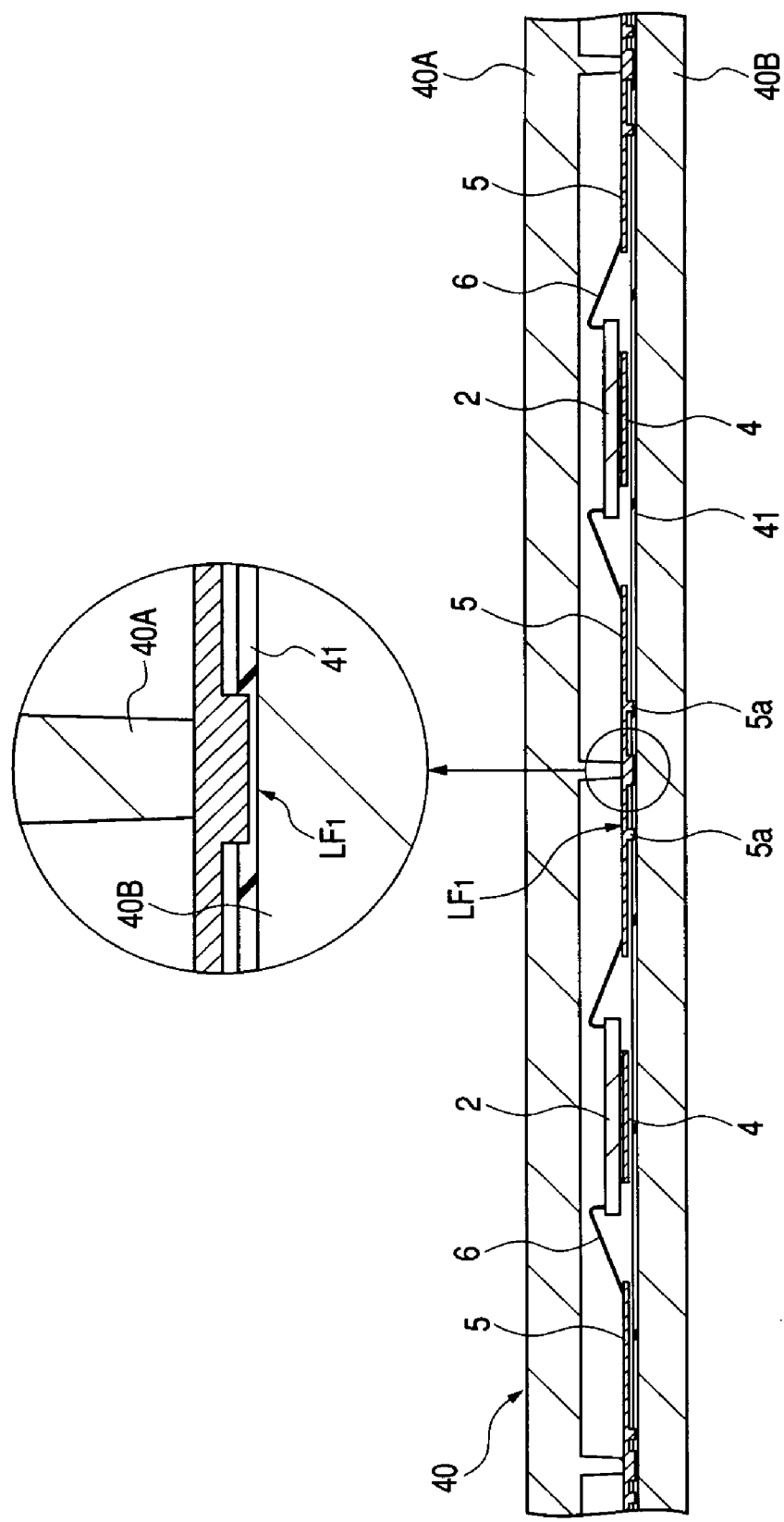
FIG. 19 is a sectional view of a principal portion of the lead frame and the molding die, showing how to manufacture the semiconductor device of the first embodiment.

Therefore, if the height of each terminal 5a and that of each projection 8a projecting to the outside of the resin sealing member 3 are to be made as large as possible, as shown in FIG. 19, it is preferred that the portion (the circled portion in the figure) of the lead frame $LF_1$ in contact with the upper die half 40A be not subjected to half etching, but be made equal in thickness as the terminals 5a and projections 8a.

Figure 20:
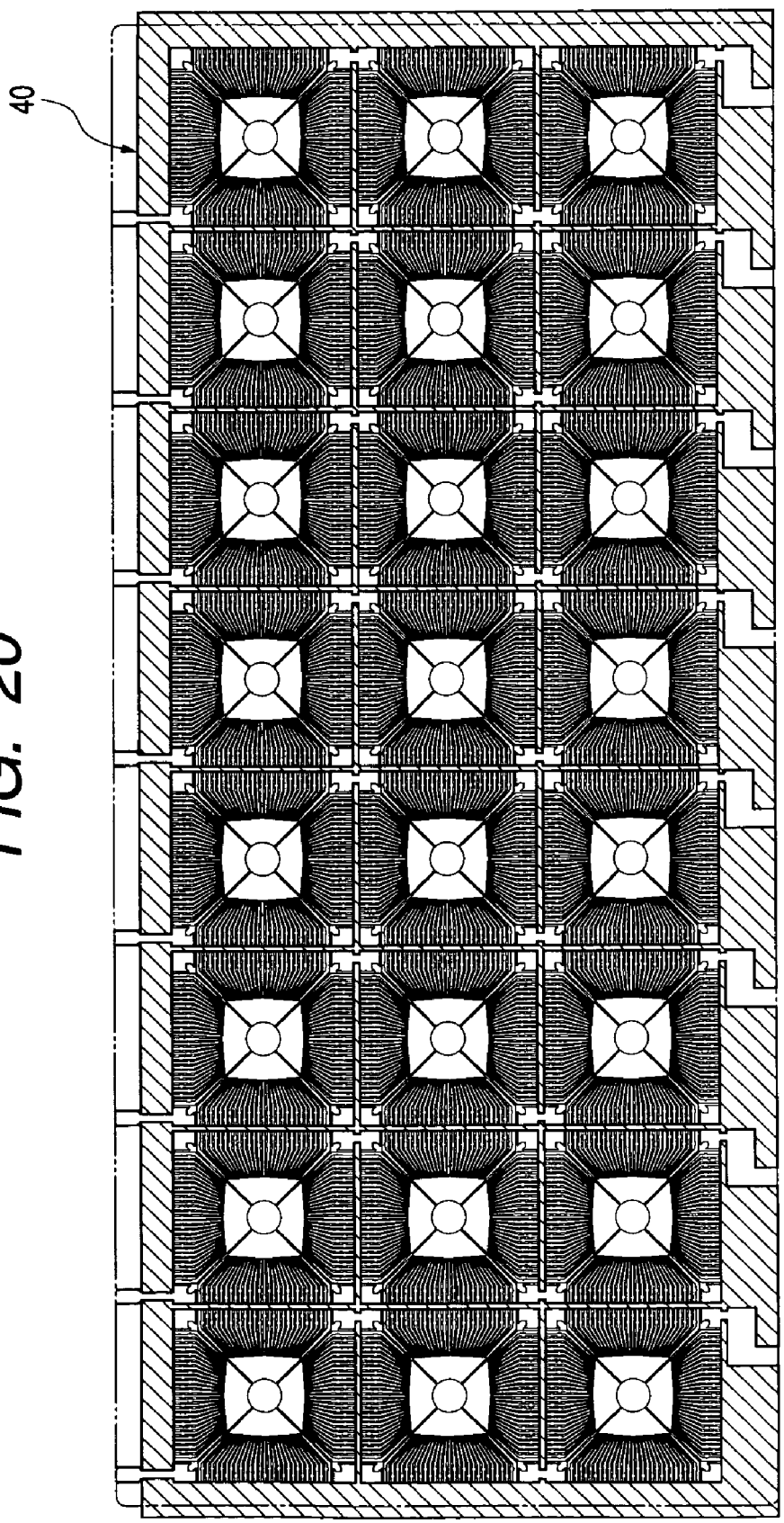
FIG. 20 is a plan view showing, with oblique lines, a portion where the upper die half of the molding die used in manufacturing the semiconductor device of the first embodiment comes into contact with the lead frame.
Figure 21:
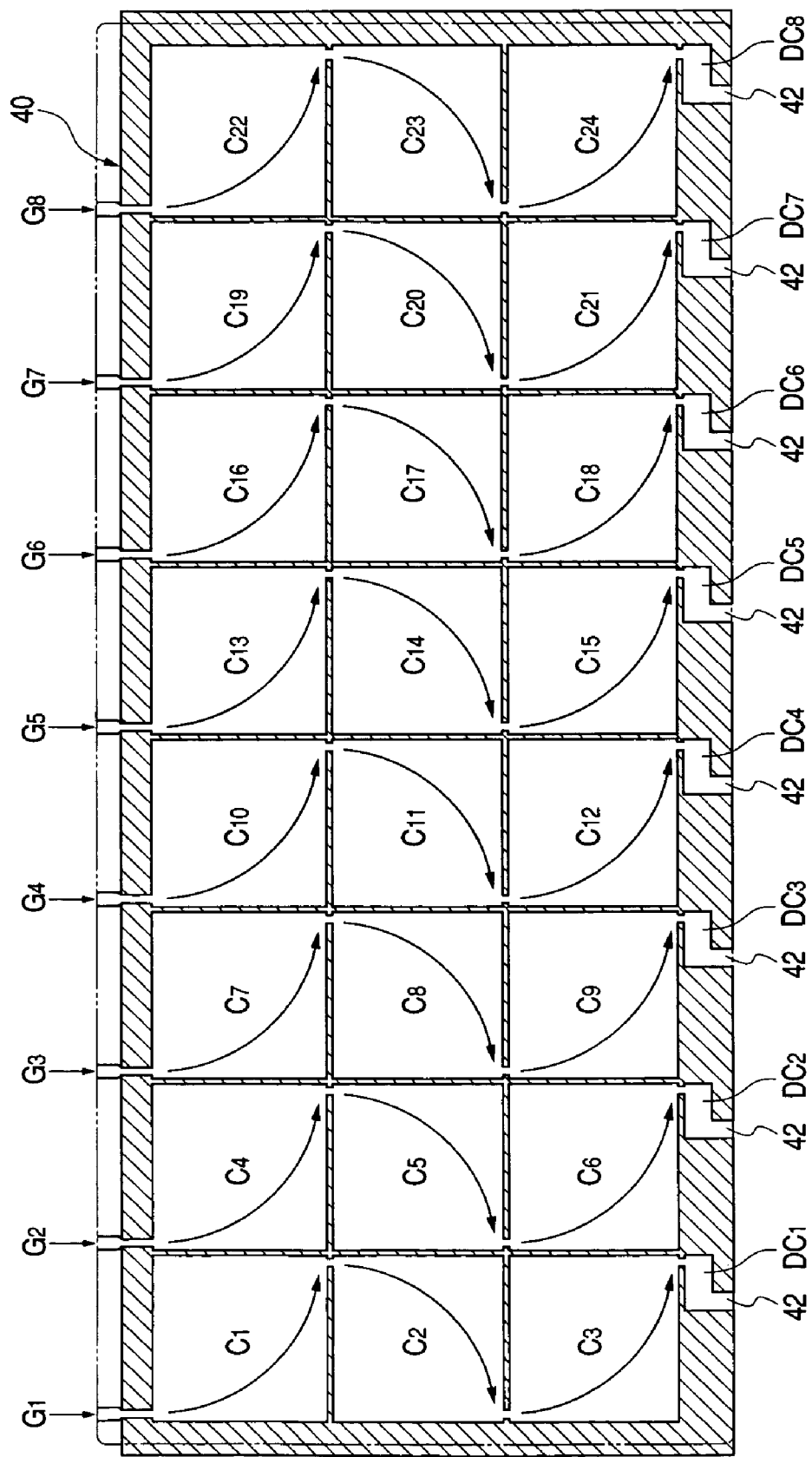
FIG. 21 is a plan view showing schematically an example of gate positions in the molding die used in manufacturing the semiconductor device of the first embodiment, as well as an example of flowing directions of resin injected into cavities.

FIG. 20 is a plan view showing, with oblique lines, portions in which the upper die half 40A of the molding die comes into contact with the lead frame $LF_1$. FIG. 21 is a plan view showing schematically gate positions in the molding die 40 and flowing directions of molten resin injected into cavities.

As shown in FIG. 20, according to the structure of the molding die 40, only outer frame portions of the lead frame $LF_1$ and connections between adjacent leads 5 are in contact with the upper die half 40A and all the other areas are utilized effectively as cavities for the injection of resin therein.

Figure 22:
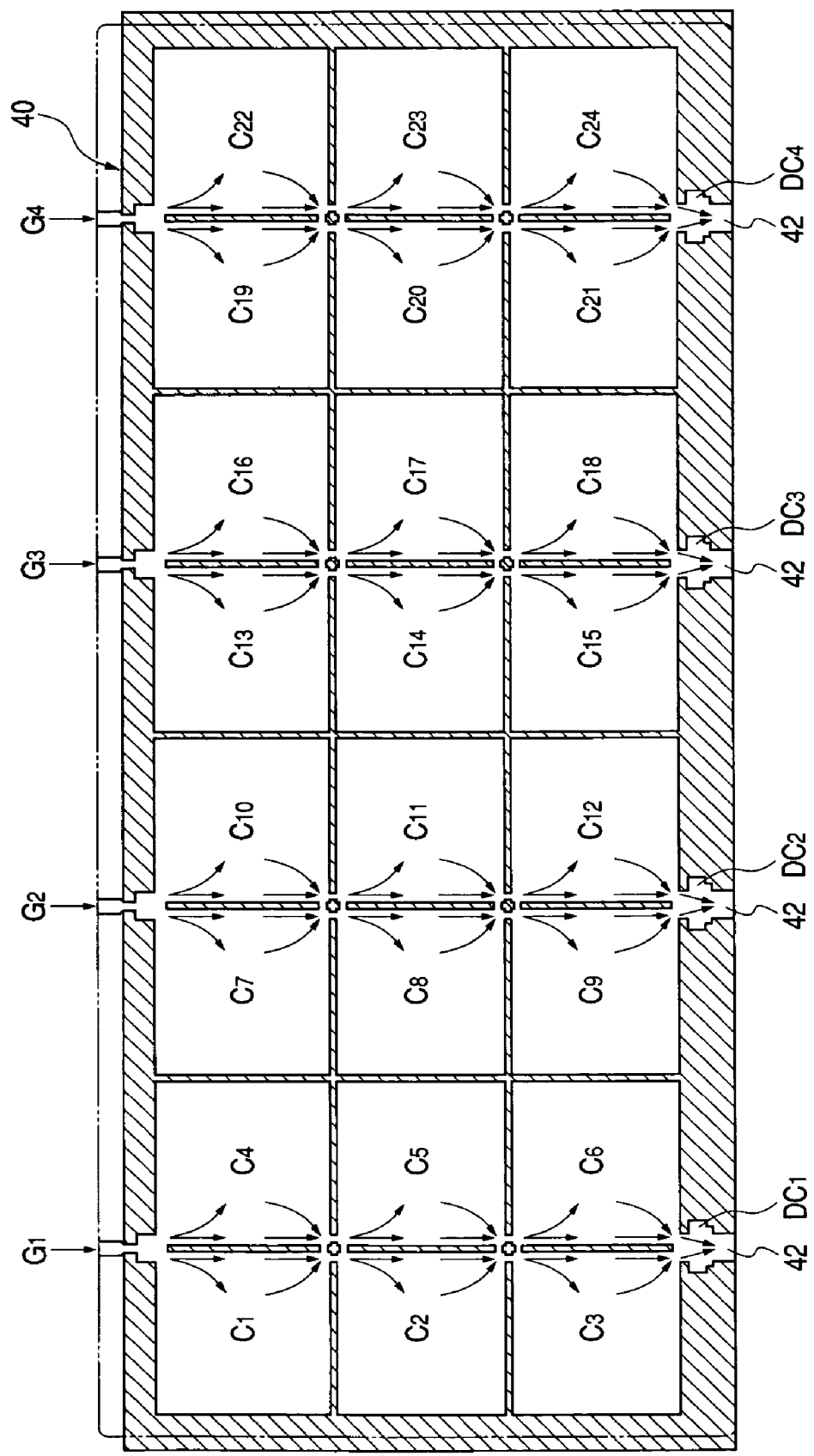
FIG. 22 is a plan view showing schematically another example of gate positions in the molding die used in manufacturing the semiconductor device of the first embodiment, as well as another example of flowing directions of resin injected to cavities.

As shown in FIG. 21, plural gates $G_1$ to $G_8$ are formed in one of long sides of the molding die 40. For example, resin is injected through the gate $G_1$ into three cavities $C_1$ to $C_3$ which are arranged in the short-side direction of the molding die 40. Further, into three cavities $C_4$ to $C_6$ adjacent to the cavities $C_1$ to $C_3$ there is injected resin through the gate $G_2$. On other hand, in the other long side of the molding die opposed to the long side where the gates $G_1$ to $G_1$ are formed there are formed dummy cavities $DC_1$ to $DC_8$ and air vents 42. For example, when resin is injected into the cavities $C_1$ to $C_3$ through the gate $G_1$, the air present within the cavities C1 to C3 flows into a dummy cavity DC1 to prevent the formation of voids in the resin injected into the cavity $C_3$. The position and number of gates to be provided in the molding die 40 are not limited to the above example. For example, there may be adopted such a structure as shown in FIG. 22 in which resin is injected to cavities $C_1$ to $C_6$ through one gate $G_1$.

Figure 23:
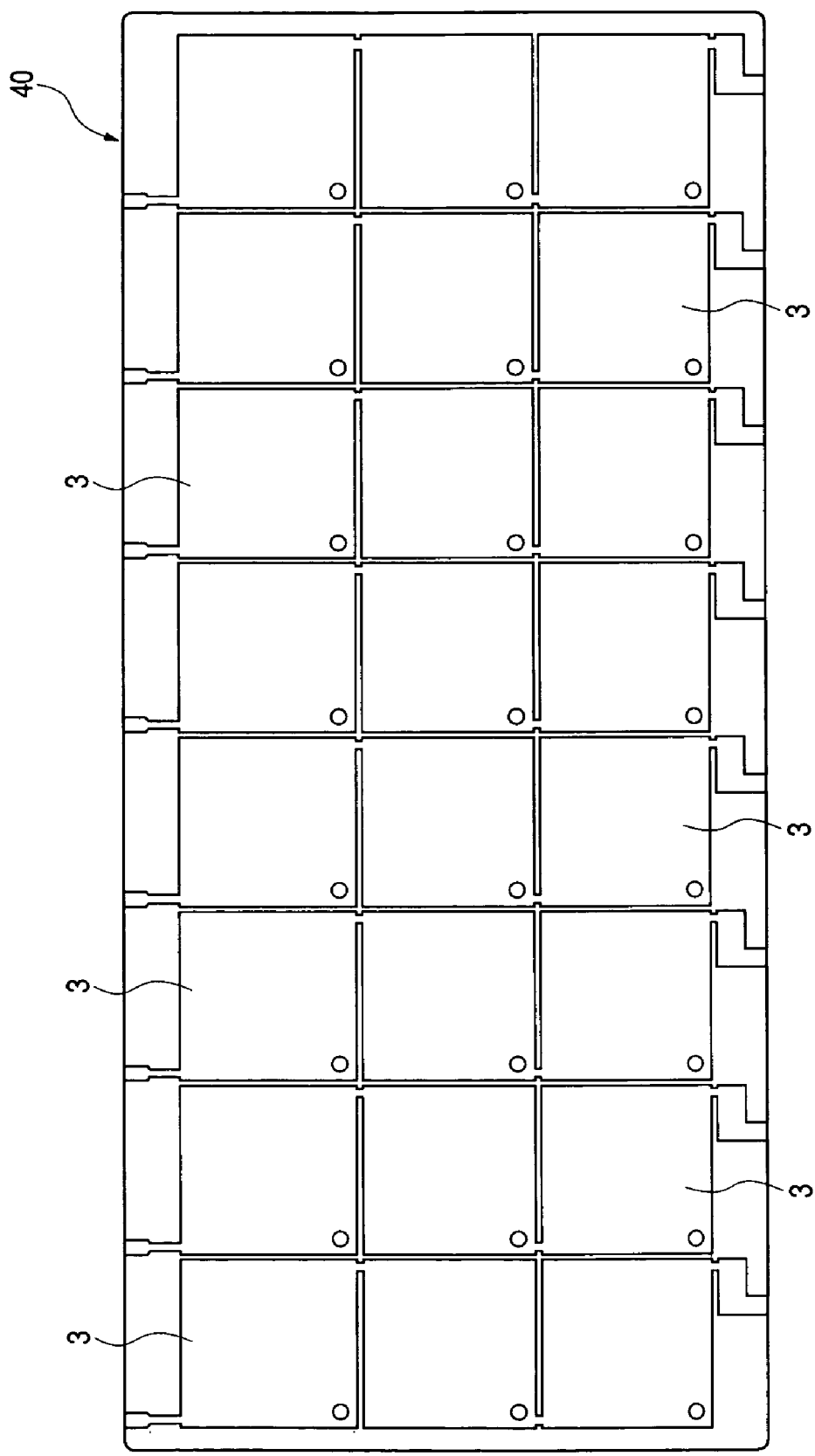
FIG. 23 is an entire plan view (surface side) of the lead frame after molding, showing how to manufacture the semiconductor device of the first embodiment.
Figure 24:
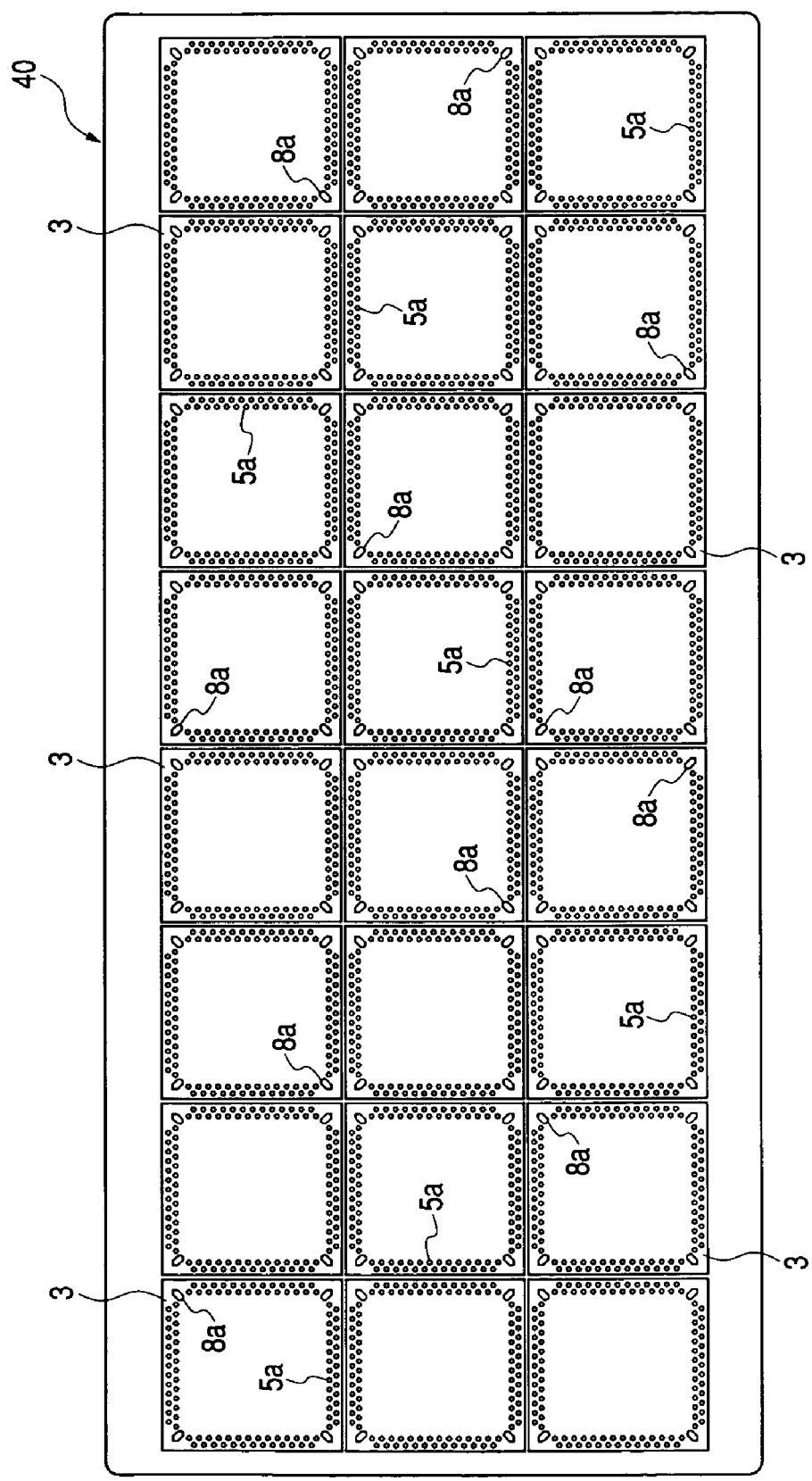
FIG. 24 is an entire plan view (back surface) of the lead frame after molding, showing how to manufacture the semiconductor device of the first embodiment.

FIG. 23 is a plan view of a surface side of a lead frame $LF_1$ fabricated by injecting resin into cavities ($C_1$ to $C_{24}$) of the molding die 40 to form resin sealing members 3 at a time and subsequent removal from the molding die, and FIG. 24 is a plan view of a back surface of the lead frame $LF_1$. As shown in FIG. 24, the terminals 5a and projections 8a are exposed to the back surface of each resin sealing member 3.

Next, solder layers 9 are printed to the surfaces of the terminals 5a and projections 8a exposed to the back surface of the resin sealing member 3 (see FIGS. 6 and 7), then a mark such as product name is printed to the surface of each resin sealing member 3, and thereafter the lead frame $LF_1$ is diced using a dicer to divide the lead frame into individual resin sealing members 3.

Figure 25:
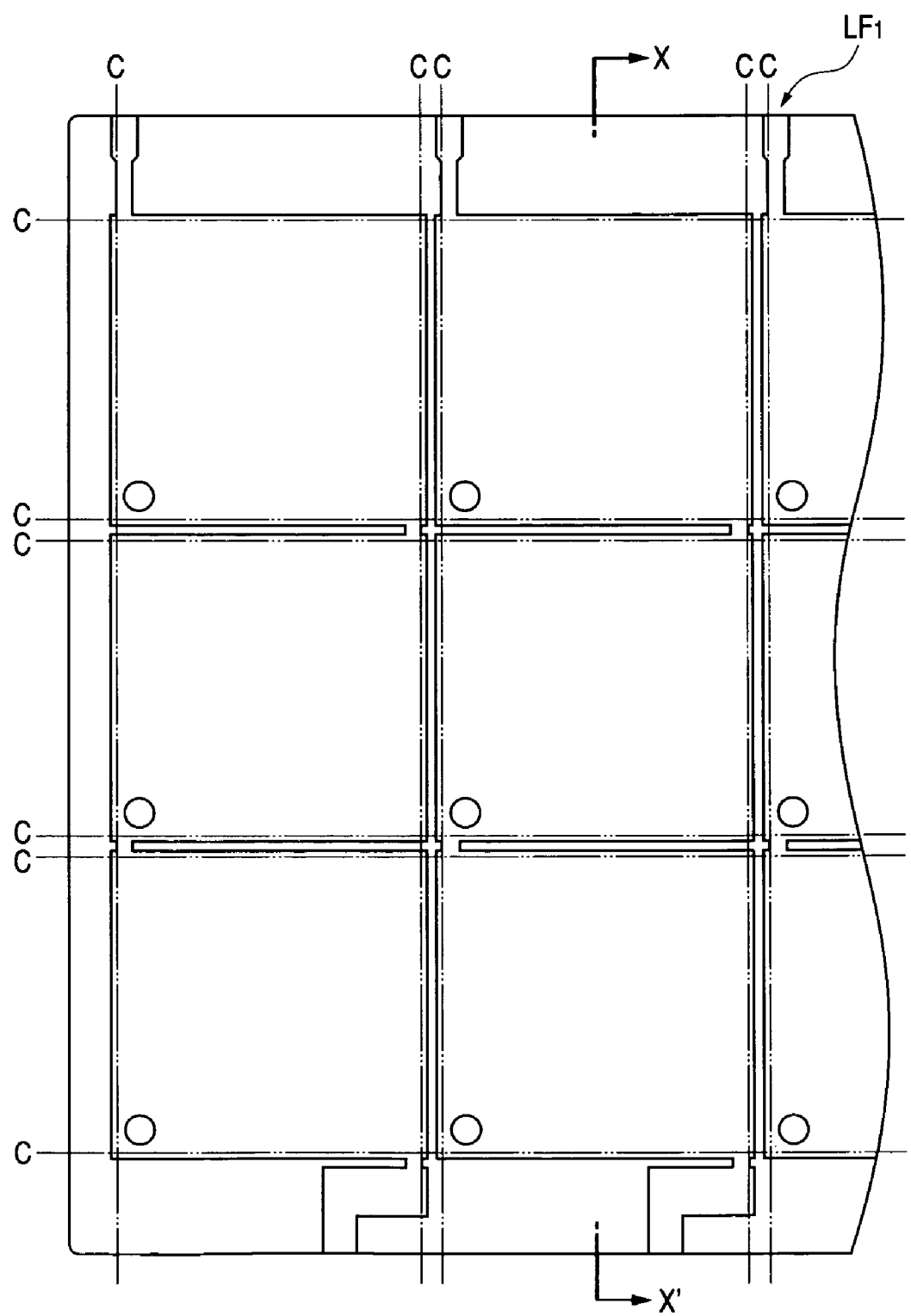
FIG. 25 is a plan view of a principal portion, showing cutting lines for cutting the lead frame after molding.
Figure 26:
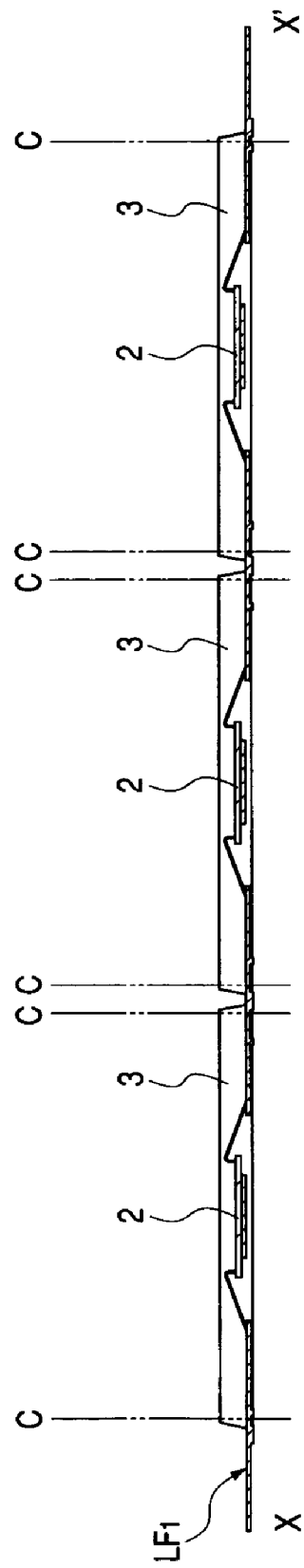
FIG. 26 is a sectional view showing cutting lines for cutting the lead frame after molding.
Figure 27:
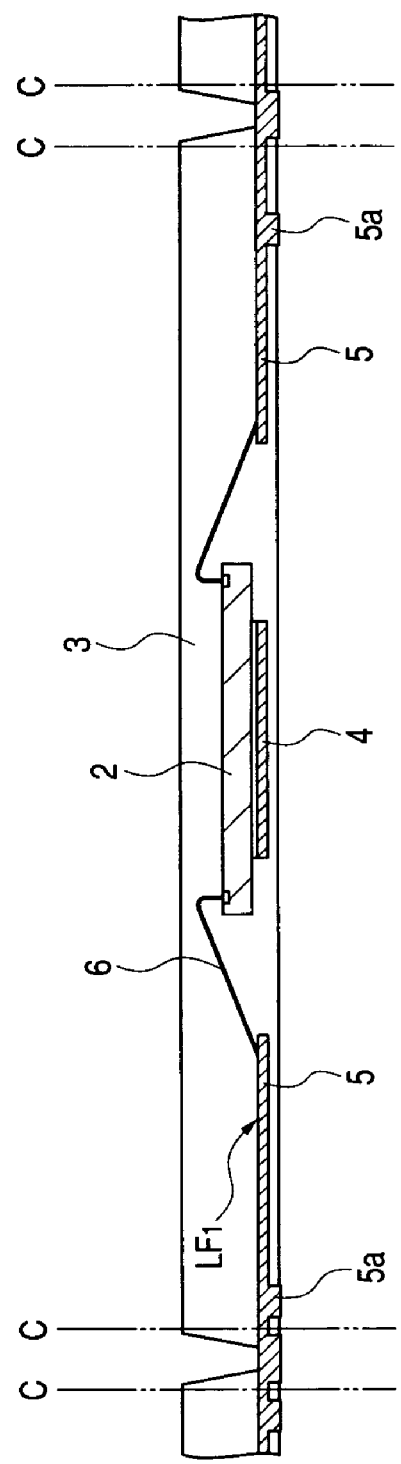
FIG. 27 is a partial enlarged sectional view of FIG. 26.

Dash-double dot lines shown in FIG. 25 (a partial plan view of the lead frame $LF_1$), FIG. 26 (a sectional view taken along line X–X' in FIG. 25) and FIG. 27 (a partial enlarged sectional view of FIG. 26) represent positions (cutting lines C) for cutting the lead frame $LF_1$.

As shown in the figures, the cutting lines C are positioned inside (central side of the resin sealing members 3) relative to lines (molding lines) extending along outer edges of the resin sealing members 3. Therefore, if peripheral portions of the resin sealing members 3 and the lead frame $LF_1$ are cut together along the cutting lines C, the whole peripheries (upper and lower surfaces and both side faces) of the leads exposed to side faces (cut faces) of each resin sealing member 3 are covered with resin, so that metallic burrs are not formed on the cut faces of the leads 5.

Figure 29:
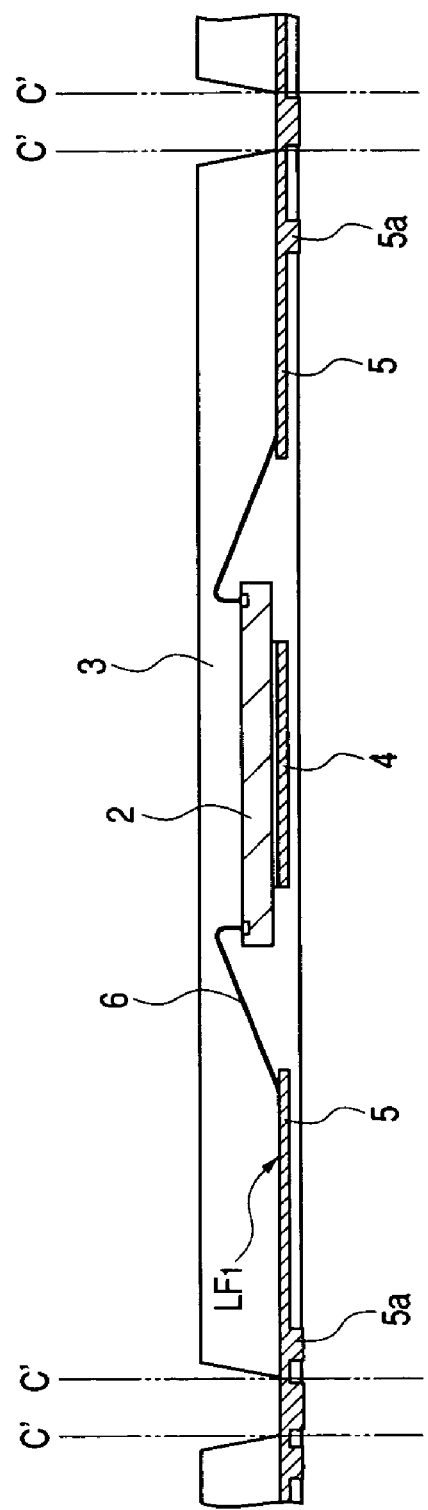
FIG. 29 is a sectional view of a principal portion, showing conventional cutting lines for cutting the lead frame after molding.

On the other hand, dash-double dot lines shown in FIG. 29 represent cutting positions (cutting lines C') in the conventional lead frame which lines are aligned with molding lines. If the lead frame $LF_1$ is cut along the cut lines C', portions (upper surfaces) of the leads 5 exposed to side faces of each resin sealing member 3 are not covered with resin, as shown in FIG. 30, so that metallic burrs are formed on the cut faces of the leads 5. If the lead frame $LF_1$ is cut outside the molding lines, the whole peripheries of the leads 5 exposed to side faces of each resin sealing member 3 are not covered with resin, so that a larger number of metallic burrs are formed on the cut faces of the leads 5.

Figure 28:
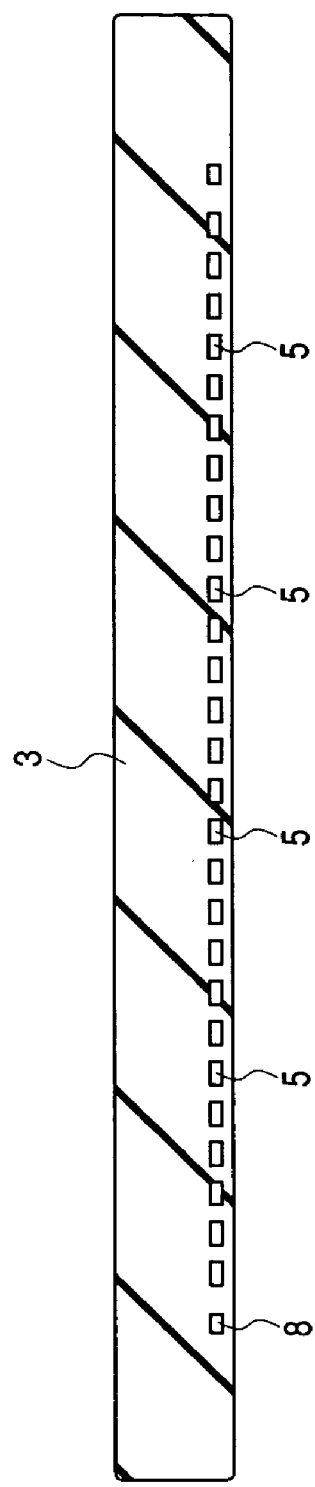
FIG. 28 is a sectional view of a resin sealing member taken along a cutting line.

In this embodiment, moreover, the front ends of the suspension leads 8 are bifurcated and are terminated at side faces of each resin sealing member 3 and therefore, as shown in FIG. 28, cut faces of the suspension leads 8 exposed to side faces of the resin sealing member 3 are covered throughout the whole peripheries thereof with resin, thus preventing the occurrence of metallic burrs.

Figure 32:
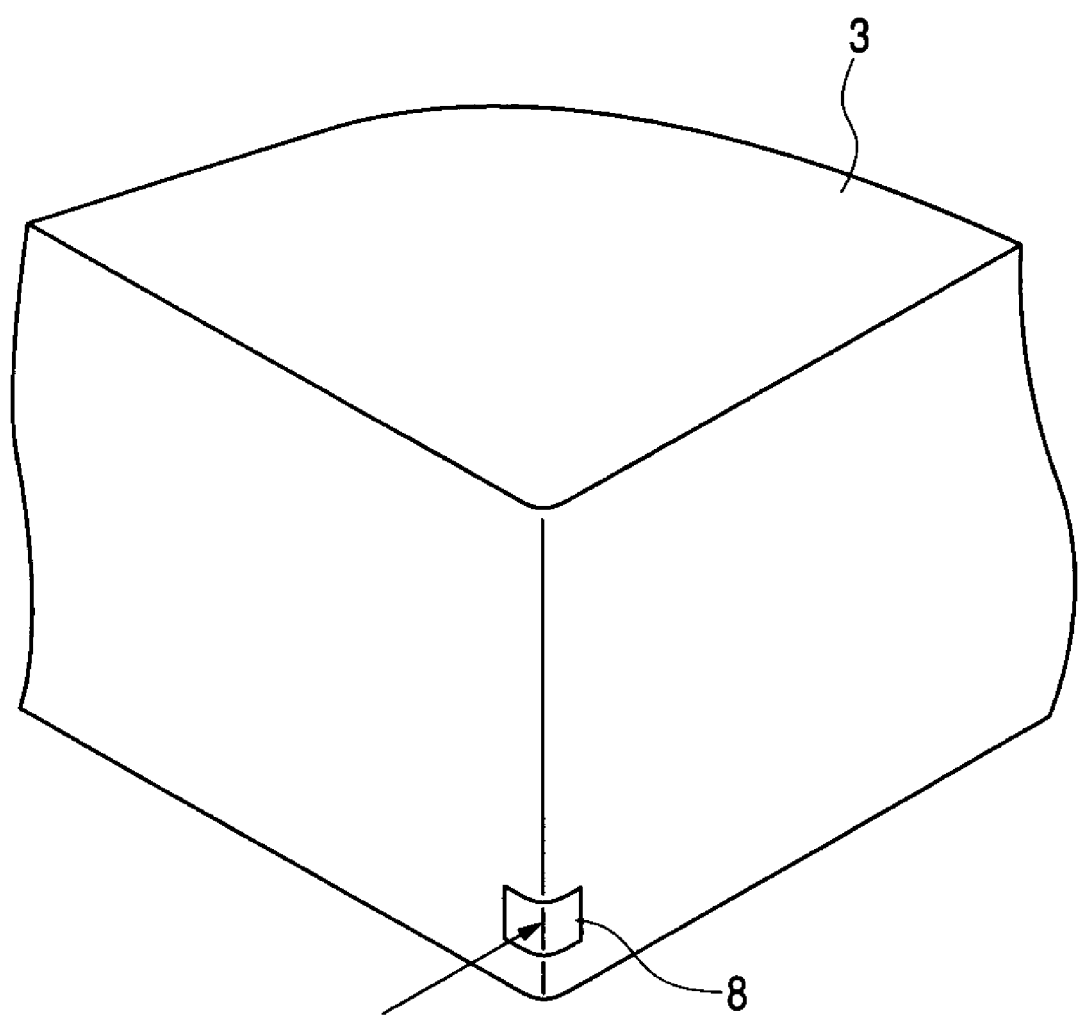
FIG. 32 is a partial enlarged perspective view of the resin sealing member, showing a cut face of a suspension lead exposed to a corner portion.

On the other hand, if the front ends of the suspension leads 8 are terminated at the corners of the resin sealing member 3, a part (as indicated with arrow in FIG. 32) of the suspension lead 8 exposed to side faces of each corner of each resin sealing member 3 is not covered with resin and metallic burrs are formed therein, as shown in FIGS. 31 and 32, not only in the case where the lead frame $LF_1$ is cut along the cutting lines C' (molding lines) but also in the case where peripheral portions of the resin sealing members 3 and the lead frame $LF_1$ are cut along the cutting line C.

Figure 33:
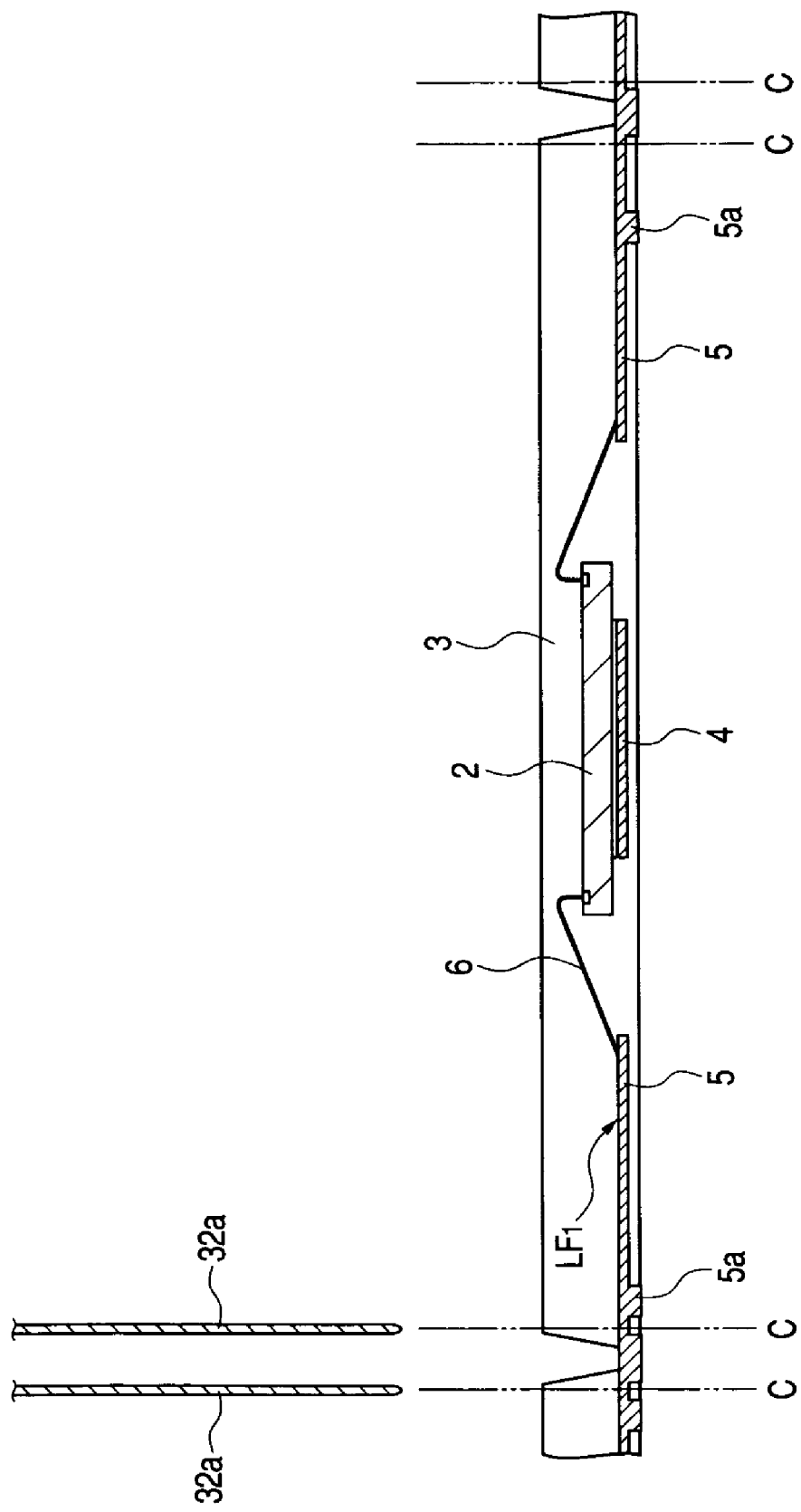
FIG. 33 is a sectional view of a principal portion, showing an example of a lead frame cutting method.
Figure 34:
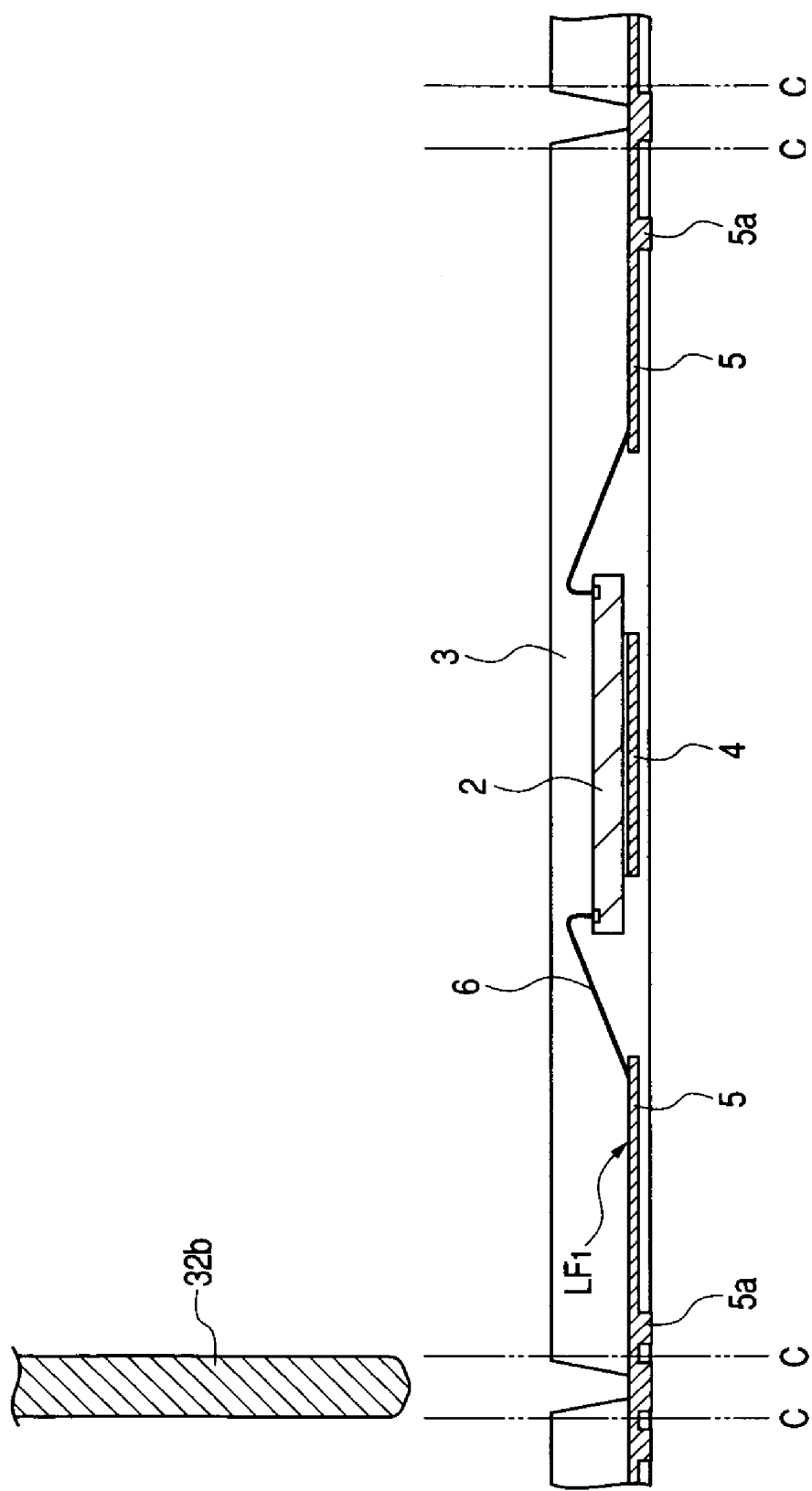
FIG. 34 is a sectional view of a principal portion, showing another example of a lead frame cutting method.

In case of cutting peripheral portions of the resin sealing members 3 and the lead frame $LF_1$ along the cutting lines C, there may be used a dicer having two blades 32a arranged through the same spacing as the spacing between two adjacent cutting lines C, as shown in FIG. 33, or a dicer provided with a blade 32b having the same width as t the spacing between adjacent cutting lines C, whereby the cutting work can be done quickly.

If the peripheral portion of each resin sealing member is cut with a dicer, external dimensions of the resin sealing member 3 become smaller than its external dimensions just after the molding. For this reason, internal dimensions of each cavity in the molding die 40 used in this embodiment are set a little larger than external dimensions of QFN 1 at completion.

By thus dividing into individual resin sealing members 3, the QFN 1 of this embodiment is completed, as shown in FIGS. 1 to 7.

Thus, in this embodiment, the peripheral portion of each resin sealing member 3 is also cut simultaneously with cutting the lead frame $LF_1$ with a dicer, whereby the whole peripheries of the front ends of the leads 5 and suspension leads 8 exposed to side faces of the resin sealing member 3 are covered with resin. As a result, the cut faces of the leads 5 and suspension leads 8 are free of metallic burrs and therefore it is possible to improve the production yield of QFN 1.

(Second Embodiment)

Figure 35:
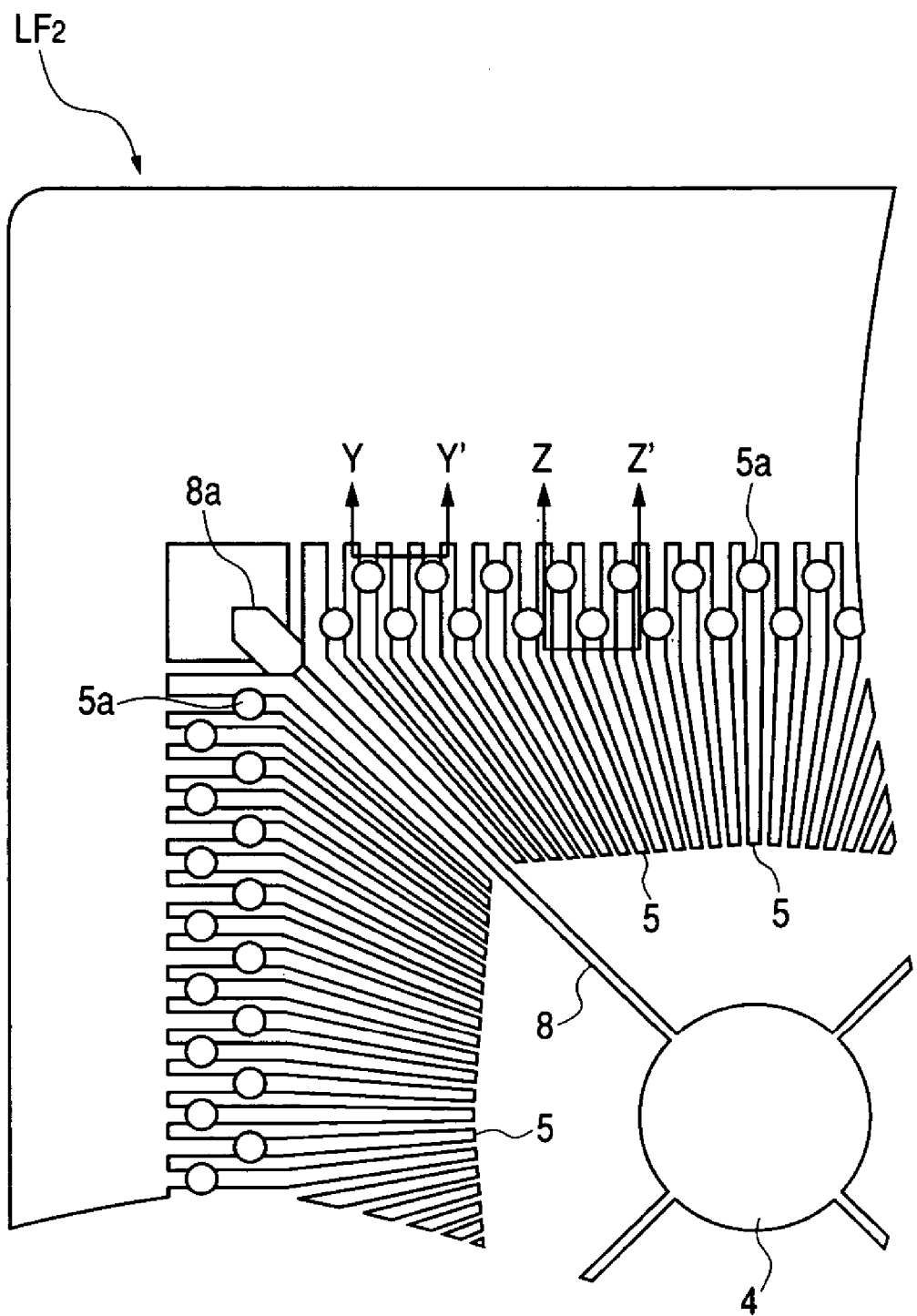
FIG. 35 is a plan view of a principal portion of a lead frame used in manufacturing a semiconductor device according to a second embodiment of the present invention.
Figure 36:
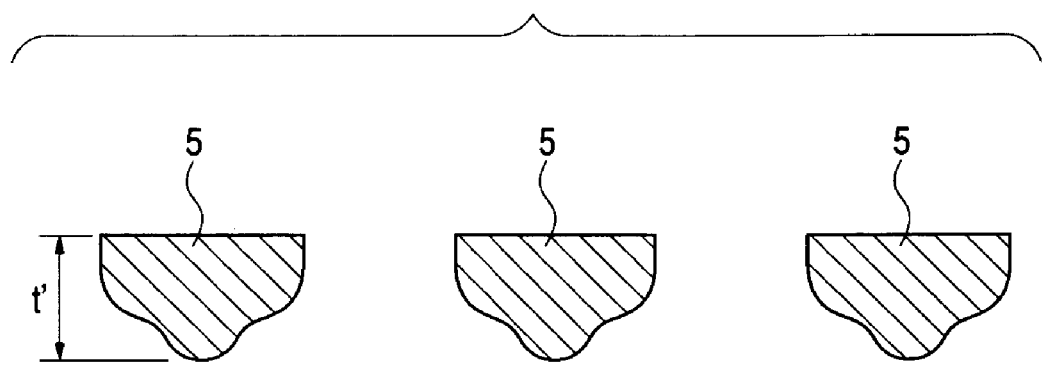
FIG. 36 is a sectional view of the lead frame taken along line Y–Y' in FIG. 35.
Figure 37:
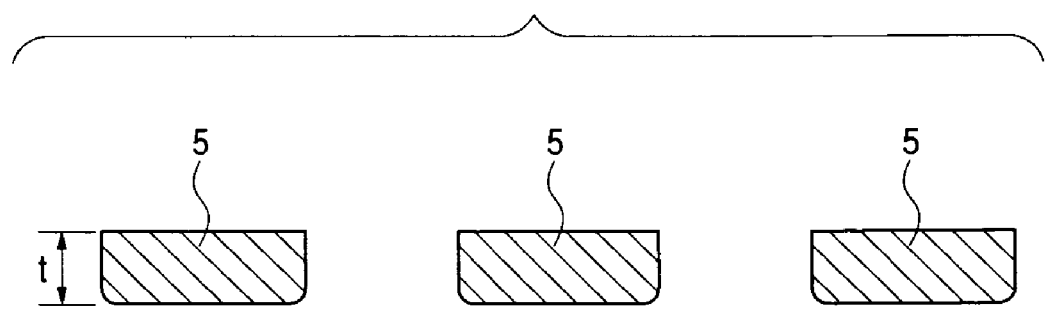
FIG. 37 is a sectional view of the lead frame taken along line Z–Z' in FIG. 35.

FIG. 35 is a plan view showing a part of the lead frame $LF_2$ used in manufacturing the QFN 1, FIG. 36 is a sectional view taken along line Y–Y' in FIG. 35, and FIG. 37 is a sectional view taken along line Z–Z' in FIG. 35.

As shown in the figures, each of plural leads 5 formed in a lead frame $LF_2$ used in this embodiment is different in thickness between inside (closer to a die pad portion 4) and outside of the portion where each of terminals 5a is formed. More specifically, in each lead 5, the thickness (t') of an outside portion (FIG. 36) of the terminal 5a is larger than the thickness (t) of an inside portion (FIG. 37) of the terminal 5a (t'>t).

Figure 38:
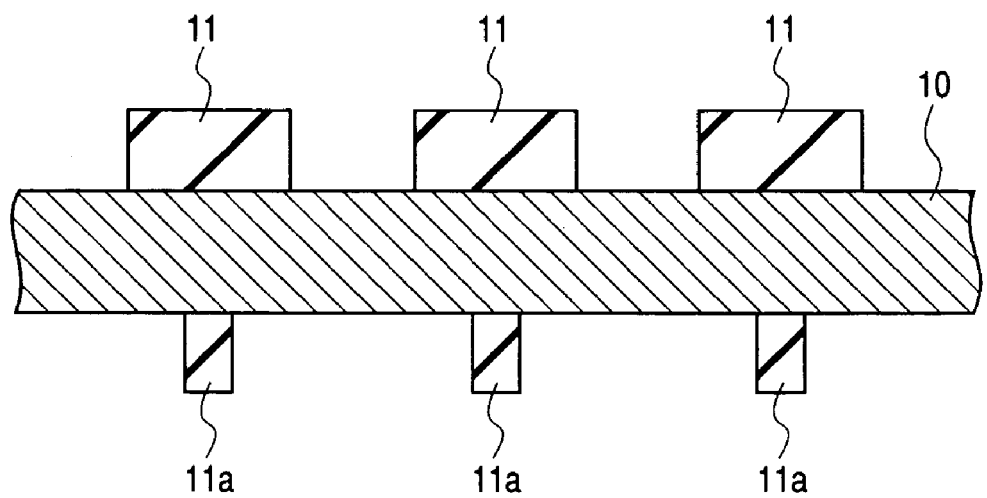
FIG. 38 is an explanatory diagram showing how to fabricate the lead frame illustrated in FIGS. 35 to 37.
Figure 39:
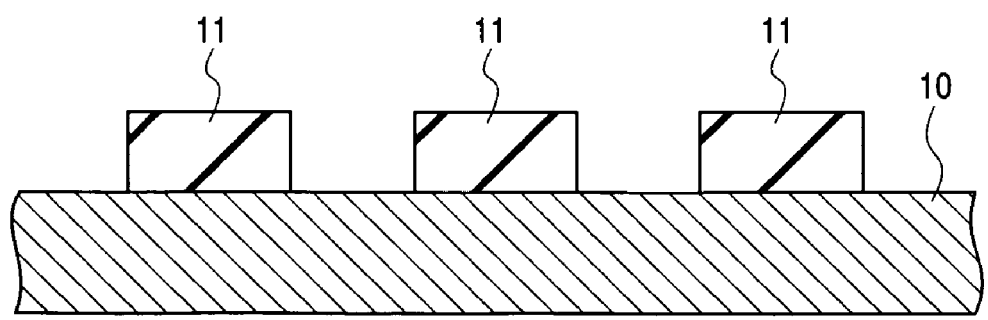
FIG. 39 is an explanatory diagram showing how to fabricate the lead frame illustrated in FIGS. 35 to 37.

The lead frame $LF_2$ is fabricated by the method of half-etching a metallic sheet 10 described in the previous first embodiment (see FIGS. 9 and 10), but a difference from the first embodiment resides in that, at the time of forming photoresist films 11 on one side of the lead-forming area of the metallic sheet 10, as shown in FIG. 38, photoresist films 11a narrower than the photoresist film 11 are formed in the portion outside the portion where terminals 5a are formed and on the side opposite to the lead-forming area. On the other hand, as shown in FIG. 39, in the portion inside the portion where terminals 5a are formed, photoresist films 11 are formed on only one side of the lead-forming area of the metallic sheet 10. Though not shown, in the portion where terminals 5a are formed, photoresist films are formed on both sides of the metallic sheet 10 as is the case with the first embodiment.

Figure 40:
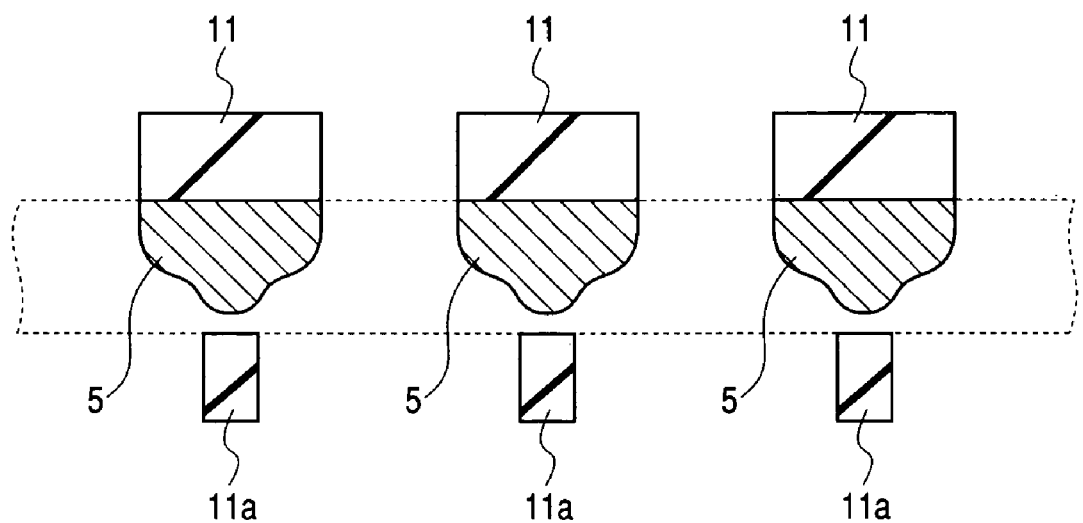
FIG. 40 is an explanatory diagram showing how to fabricate the lead frame illustrated in FIGS. 35 to 37.
Figure 41:
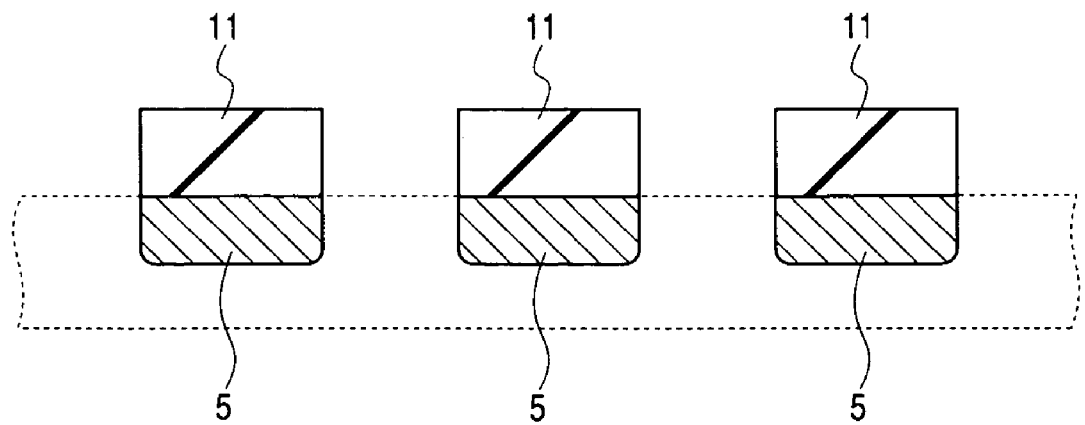
FIG. 41 is an explanatory diagram showing how to fabricate the lead frame illustrated in FIGS. 35 to 37.

If the metallic sheet 10 is etched in this state with a medical liquid, centrally thick leads 5 having such a sectional shape as shown in FIG. 40 are formed outside the terminals 5a because the amount of etching is different between both sides of the metallic sheet 10. On the other hand, in the portion inside the terminals 5a, thin leads 5 having such a sectional shape as shown in FIG. 41 are formed because only the side free of photoresist films 11 is subjected to half etching. Thereafter, by removing photoresist films 11 and 11a remaining on the surface of the metallic sheet 10 there is obtained such a lead frame $LF_2$ as shown in FIGS. 35 to 37.

The method of half-etching the metallic sheet to form patterns (die pad portion 4, leads 5, and suspension leads 8) is an effective method for diminishing the pitch of leads 5 and attain a multi-pin structure, but the rigidity of the leads 5 becomes deficient because of a small thickness of the leads 5. As a result, there arises a problem that, at the time of loading the lead frame into the molding die 40 used in the first embodiment and forming resin sealing members 3, the force of the terminals 5a formed on leads 5 for pressing down the resin sheet 41 becomes weak and the height of terminals 5a projecting outside the resin sealing member 3 becomes smaller.

Figure 42:
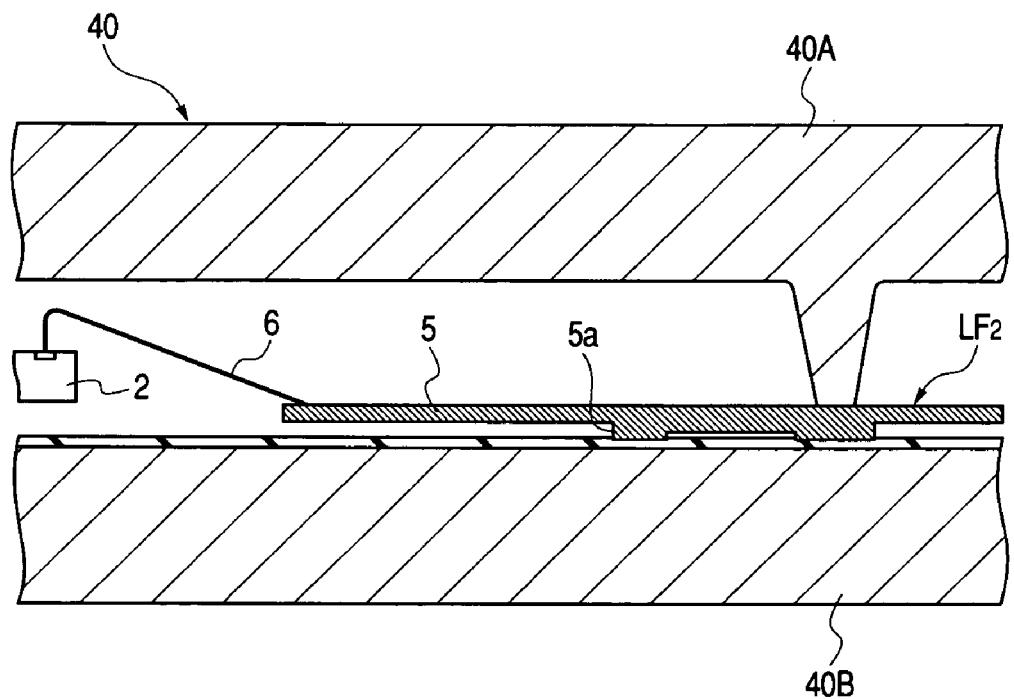
FIG. 42 is a sectional view of a principal portion of he lead frame and a molding die, showing how to manufacture the semiconductor device of the second embodiment.
Figure 43:
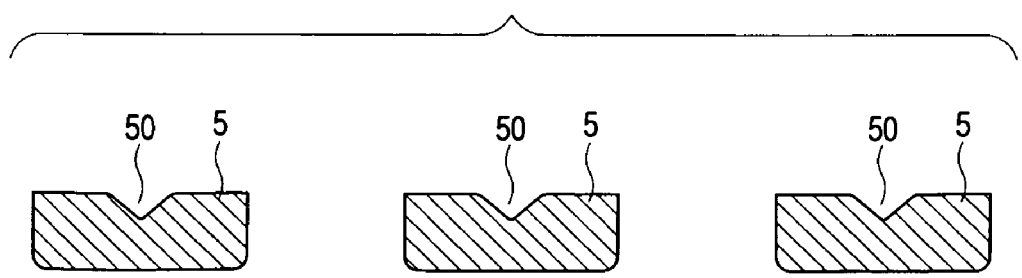
FIG. 43 is a sectional view of a principal portion of a lead frame used in manufacturing the semiconductor device of the second embodiment.

In contrast therewith, in the lead frame $LF_2$ according to this second embodiment, the leads 5 positioned outside the portion where terminals 5a are formed are formed thick, so that the rigidity of the leads 5 become so much higher. Therefore, as shown in FIG. 42, when the lead frame $LF_2$ is loaded into the molding die 40 and is pressed by both upper die half 40A and lower die half 40B, the pressing force of the terminals 5a for the resin sheet 41 becomes larger, whereby the terminals 5a projecting outside each resin sealing member 3 can be formed high. Moreover, as is the case with the first embodiment, by setting the thickness of the lead frame $LF_2$ equal to that of the terminals $5a$ in the portion where the lead frame is in contact with the upper die half 40A (see FIG. 19), it is possible to further increase the pressing force of the terminals $5a$ against the resin sheet 41.

Also in case of punching a metallic sheet with a press to form patterns (die pad portion 4, leads 5, suspension leads 8), if it is intended to narrow the pitch of leads 5 and realize a multi-pin structure, the use of a thin metallic sheet is required, with the result that the rigidity of the leads 5 becomes deficient. A countermeasure is to form a slit 50 with a press on one side of each lead 5, whereby a highly rigid lead 5 can be formed even if the metallic sheet used is thin.

(Third Embodiment)

Figure 44:
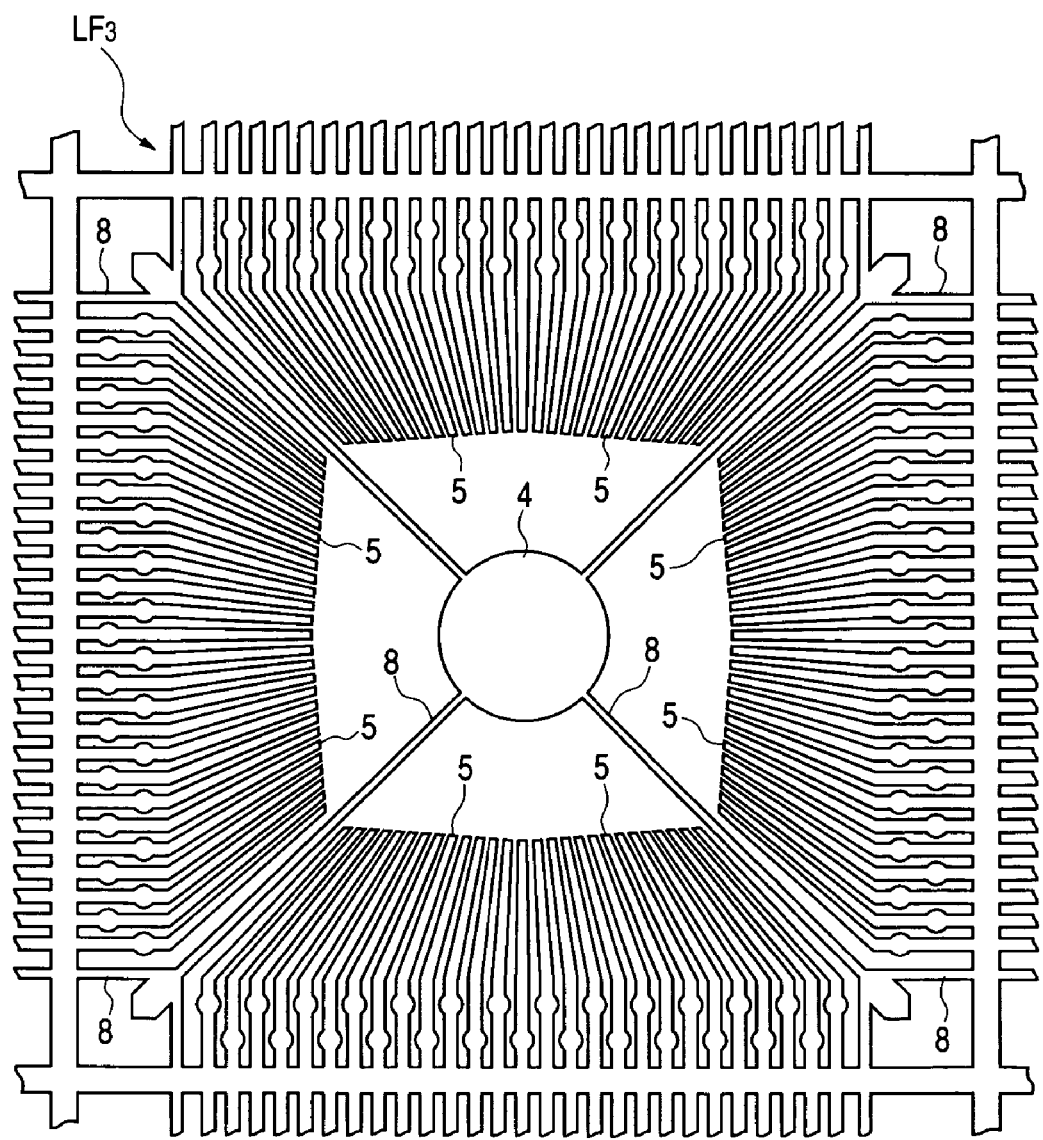
FIG. 44 is a plan view (surface side) of a principal portion of a lead frame used in manufacturing a semiconductor device according to a third embodiment of the present invention.
Figure 45:
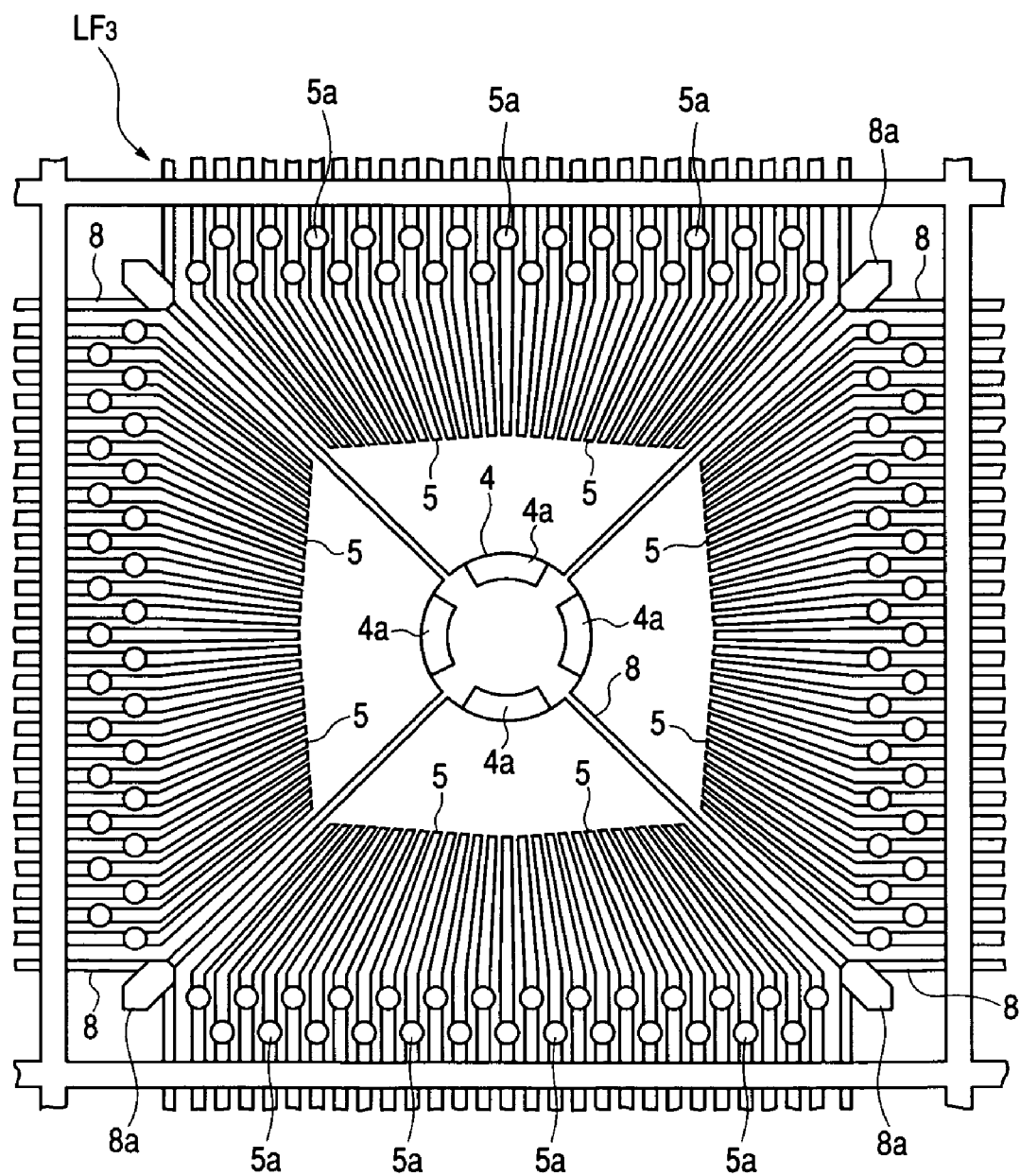
FIG. 45 is a plan view (back surface side) of a principal portion of the lead frame used in manufacturing the semiconductor device of the third embodiment.
Figure 46:
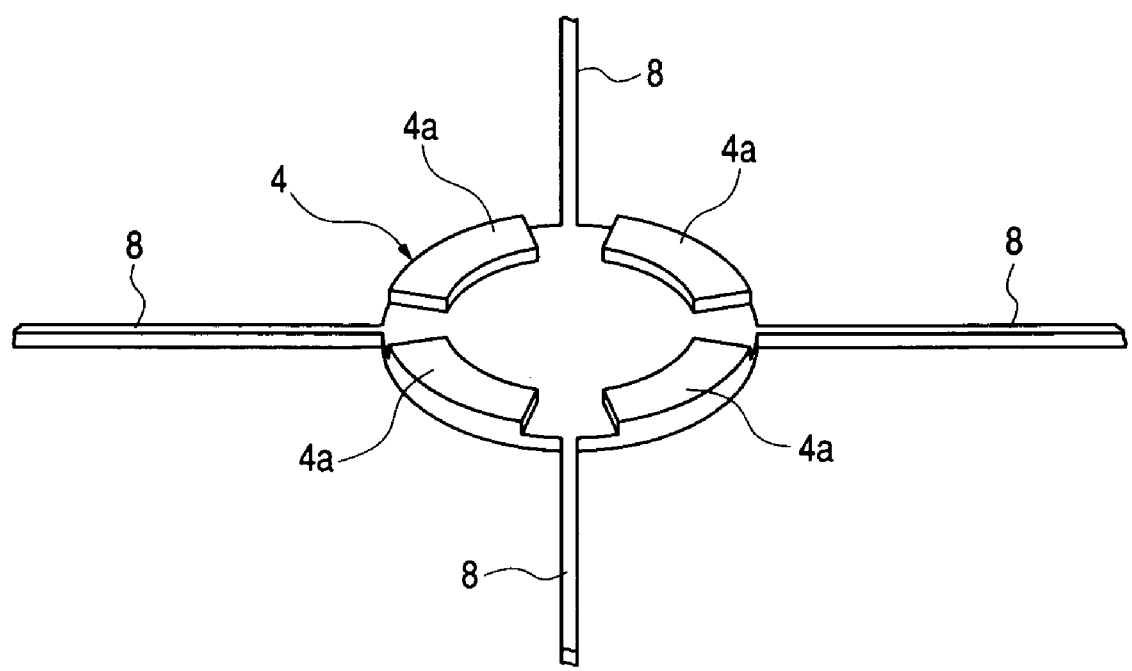
FIG. 46 is a perspective view showing a die pad portion of the lead frame illustrated in FIGS. 44 and 45.

FIG. 44 is a plan view showing a part of a surface of a lead frame $LF_3$ used in manufacturing $QF_1$, FIG. 45 is a plan view showing a part of a back surface of the lead frame $LF_3$, and FIG. 45 is a perspective view showing a central portion (the area where a die pad portion 4 is formed) on a larger scale.

The lead frame $LF_3$ is characteristic in that plural projections $4a$ are formed along an outer periphery of a back surface of the die pad portion 4. As shown in FIG. 47, the projections $4a$ are formed simultaneously with forming patterns (die pad portion 4, leads 5, suspension leads 8) of the lead frame $LF_3$. More specifically, there is provided a metallic sheet 10 of, for example, Cu, Cu alloy, or Fe—Ni alloy having a thickness of 125 to 150 μm, and one side of the metallic sheet 10 is coated with photoresist film 11 in portions where a die pad 4 and leads 5 (and suspension leads 8 not shown) are to be formed. In portions where terminals $5a$ and projections $4a$ (and projections $8a$ of suspension leads 8 not shown) are to be formed, both sides of the metallic sheet 10 are coated with photoresist film 11. If the metallic sheet 10 is half-etched in this state with a medical liquid, a die pad portion 4 and leads 5 (and suspension leads 8 not shown) having a thickness about half of the thickness of the metallic sheet 10 are formed in the area where only one side is coated with photoresist film 11. In the area where both sides are coated with photoresist film 11 there are formed terminals $5a$ and projections (and projections $8a$ of suspension leads 8 not shown) having the same thickness as the metallic sheet 10.

For fabricating QFN 1 with use of the lead frame $LF_3$, a semiconductor chip 2 is mounted on the die pad portion 4 in the manner described above and is connected with the leads 5 through Au wires 6, then the lead frame $LF_3$ is loaded into the molding die 40, as shown in FIG. 48. At this time, in this embodiment, the gap between the upper die half 40A and the semiconductor chip 2 is set wider than the gap between the lower die half 40B and the semiconductor chip 2.

If in this state the lead frame $LF_3$ is pinched by both upper die half 40A and lower die half 40B, the terminals $5a$ formed on the back surface of the leads 5 and the projections $4a$ formed on the back surface of the die pad portion 4 come into contact with resin sheet 41 laid over the surface of the lower die half 40B and their tips bite into the resin sheet 41.

Next, as shown in FIG. 49, molten resin 51 is injected through a gate into each cavity formed in the molding die 40. At this time, the amount of molten resin 51 getting into the gap between the upper die half 40A and the semiconductor chip 2 is larger than that getting into the gap between the lower die half 40A and the semiconductor chip 2 because the former gap is wider than the latter gap. Consequently, a downward pressure is exerted on an upper surface of the semiconductor chip 2 mounted on the die pad portion 4 from the molten resin 51 which has entered the gap between the upper die half 40A and the semiconductor chip 2. However, since the projections $4a$ formed on the back surface of the die pad portion 4 is in contact with the resin sheet 41, there is no fear that a positional deviation of the semiconductor chip 2 may be caused by the pressure of the molten resin 51.

Figure 50:
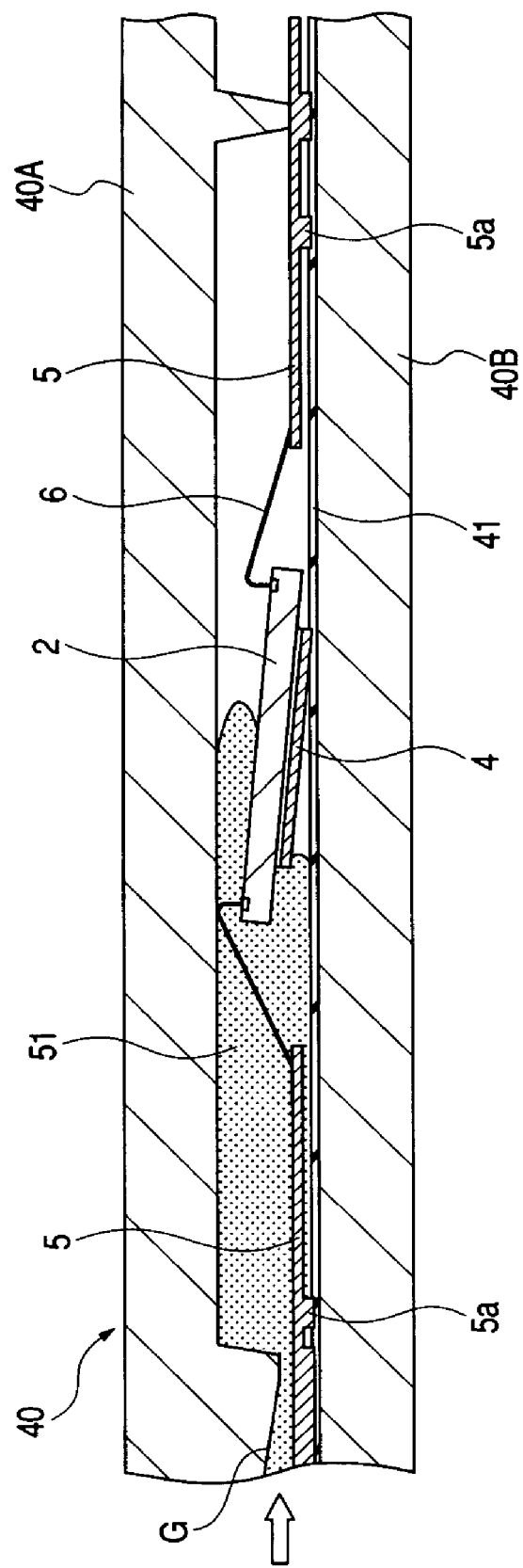
FIG. 50 is a sectional view of a principal portion of a lead frame and a molding die, showing a problem involved in a molding step for a resin sealing member.

In contrast therewith, as shown in FIG. 50, if the projections $4a$ are not formed on the back surface of the die pad portion 4, the semiconductor chip 2 undergoes a positional deviation under the pressure of molten resin 51 and there arise defects such as Au wires 6 being exposed from the upper surface of the resin sealing member 3 or the die pad portion 4 being exposed from the underside of the resin sealing member 3.

Heretofore, as measure for preventing a positional deviation of the semiconductor chip 2 caused by a pressure developed when molten resin 51 flows into a die cavity, there has been adopted a "tab-up technique" wherein the suspension leads 8 which support the die pad portion 4 are bent to equalize the gap between the upper die half 40A and the semiconductor chip 2 to the gap between the lower die half 40B and the semiconductor chip 2. However, as the pitch of the leads 5 becomes more and more narrow with the attainment of a multi-pin structure of QFN 1 and the thickness of the metallic sheet which constitutes the lead frame becomes extremely small, the rigidity of the suspension leads 8 is deteriorated. As result, it is difficult to prevent a positional deviation of the semiconductor chip 2 even if there is adopted the "tab-up" technique.

On the other hand, according to this embodiment wherein projections $4a$ are formed on the back surface of the die pad portion 4 and are brought into close contact with the resin sheet 41 laid on the lower die half 40B, the metallic sheet which constitutes the lead frame $LF_3$ becomes extremely thin, and even in the case where the rigidity of the suspension leads 8 is deteriorated, it is possible to surely prevent a positional deviation of the semiconductor chip 2 caused by the pressure of molten resin 51 flowing into the cavity, thus making it possible to improve the production yield of QFN 1 having a multi-pin structure.

Figure 51:
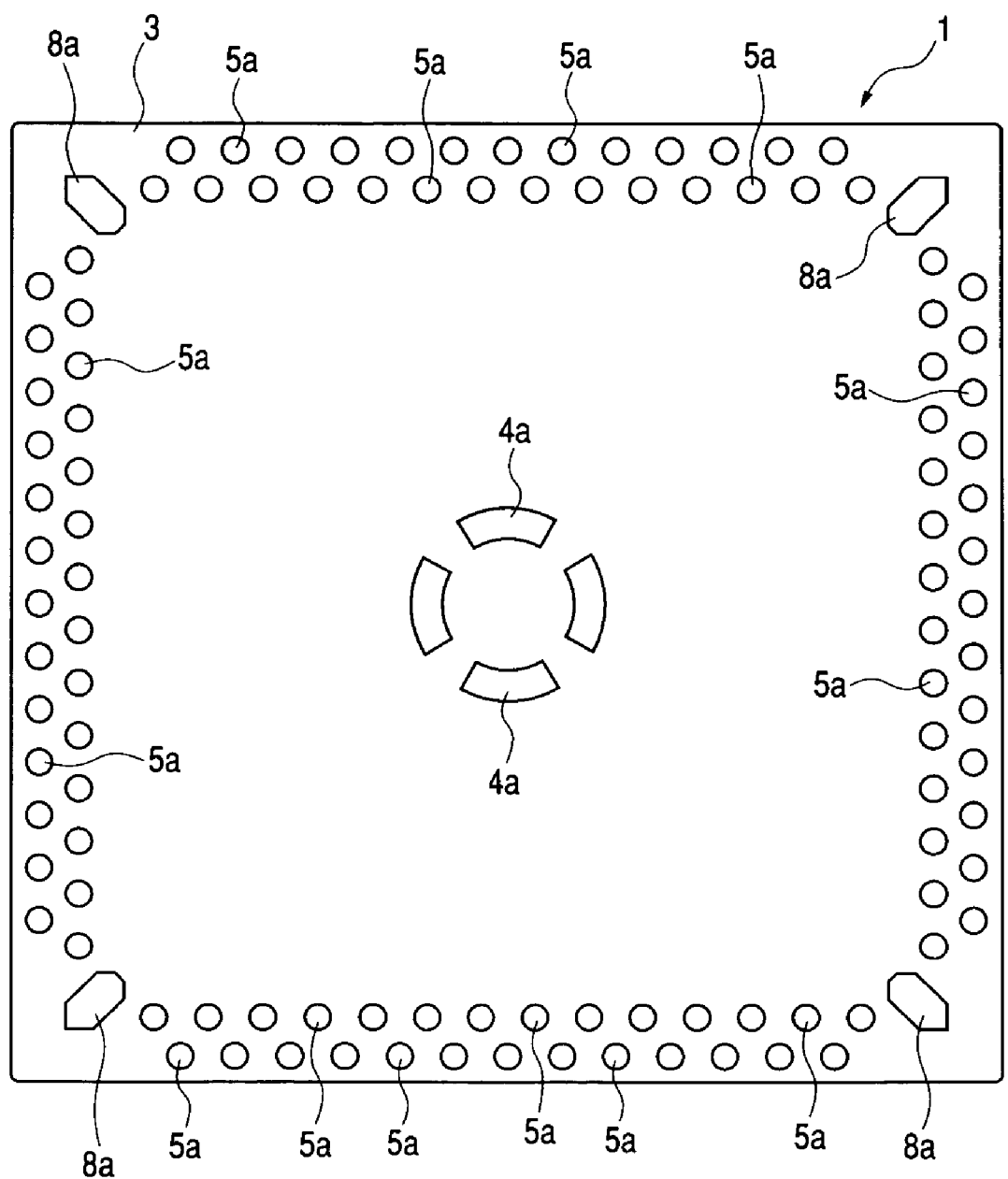
FIG. 51 is a plan view showing an appearance (back surface side) of the semiconductor device of the third embodiment.

FIG. 51 is a plan view of QFN 1 manufactured by using the lead frame $LF_3$ of this embodiment. As shown in the same figure, in case of using the lead frame $LF_3$, the projections $4a$ of the die pad portion 4 are projected to the back surface of the resin sealing member 3. Therefore, at the time of forming the solder layer 9 to each of the projections $4a$ and mounting the QFN 1 onto a wiring substrate, the surfaces of the projections $4a$ are bonded to the wiring substrate through the solder layer 9, whereby the reliability of connection between the QFN 1 and the wiring substrate can be enhanced. Further, since heat generated from the semiconductor chip 2 is transmitted to the exterior through the projections $4a$, QFN 1 superior in heat dissipating property can be provided.

Figure 52:
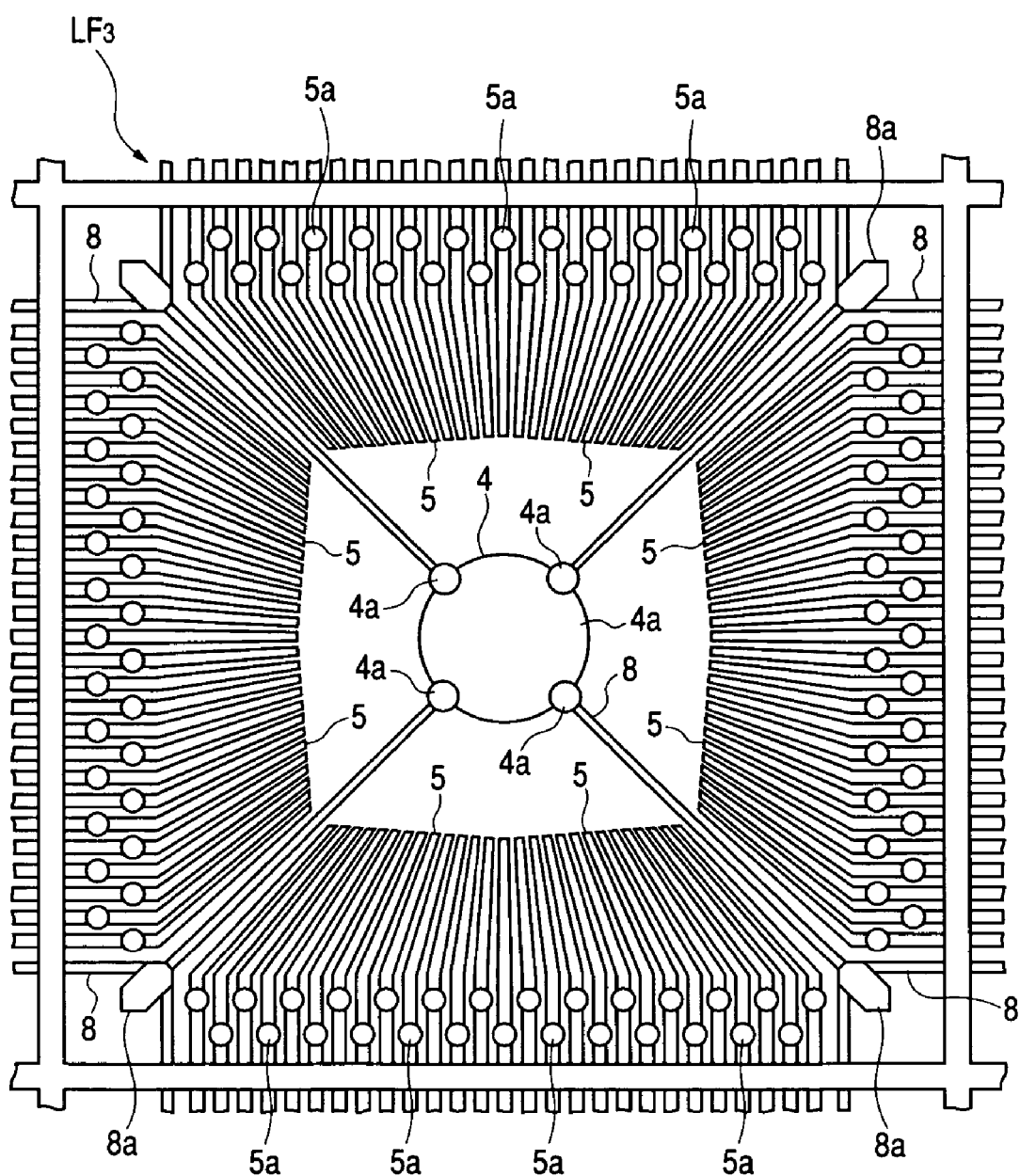
FIG. 52 is a plan view (back surface side) of a principal portion of a lead frame employable in manufacturing the semiconductor device of the third embodiment.
Figure 53:
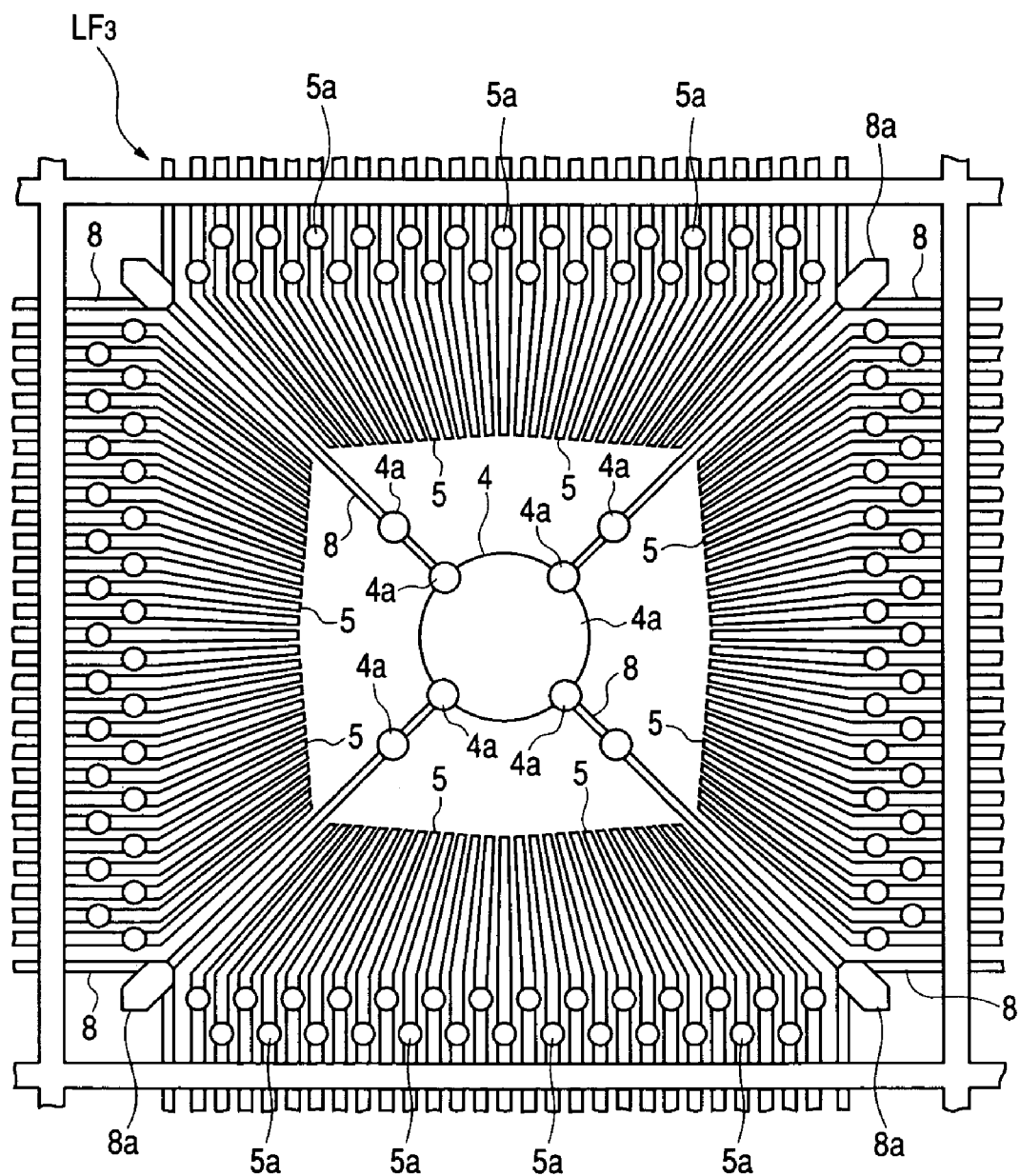
FIG. 53 is a plan view (back surface side) of a principal portion of a lead frame employable in manufacturing the semiconductor device of the third embodiment.

As to the shape of the projections $4a$ formed on the back surface of the die pad portion 4, there may be adopted any desired shape insofar as the shape adopted can prevent a positional deviation of the semiconductor chip 2 caused by pressure of molten resin 51 flowing into the cavity. For example, the projections $4a$ may be such circular projections as shown in FIG. 52, or projections $4a$ may be formed not only on the back surface of the die pad portion 4 but also on part of the back surface of each suspension lead 8 as shown in FIG. 53.

Although the present invention has been described concretely on the basis of embodiments of the invention, it goes without saying that the present invention is not limited to the above embodiments, but that various changes may be made within the scope not departing from the gist of the invention.

Although in the above embodiments patterns (die pad portion 4, leads 5, suspension leads 8) of the lead frame are formed by the half-etching method, the present invention is also applicable to the case where those patterns are formed by punching a metallic sheet with use of a press.

Figure 54:
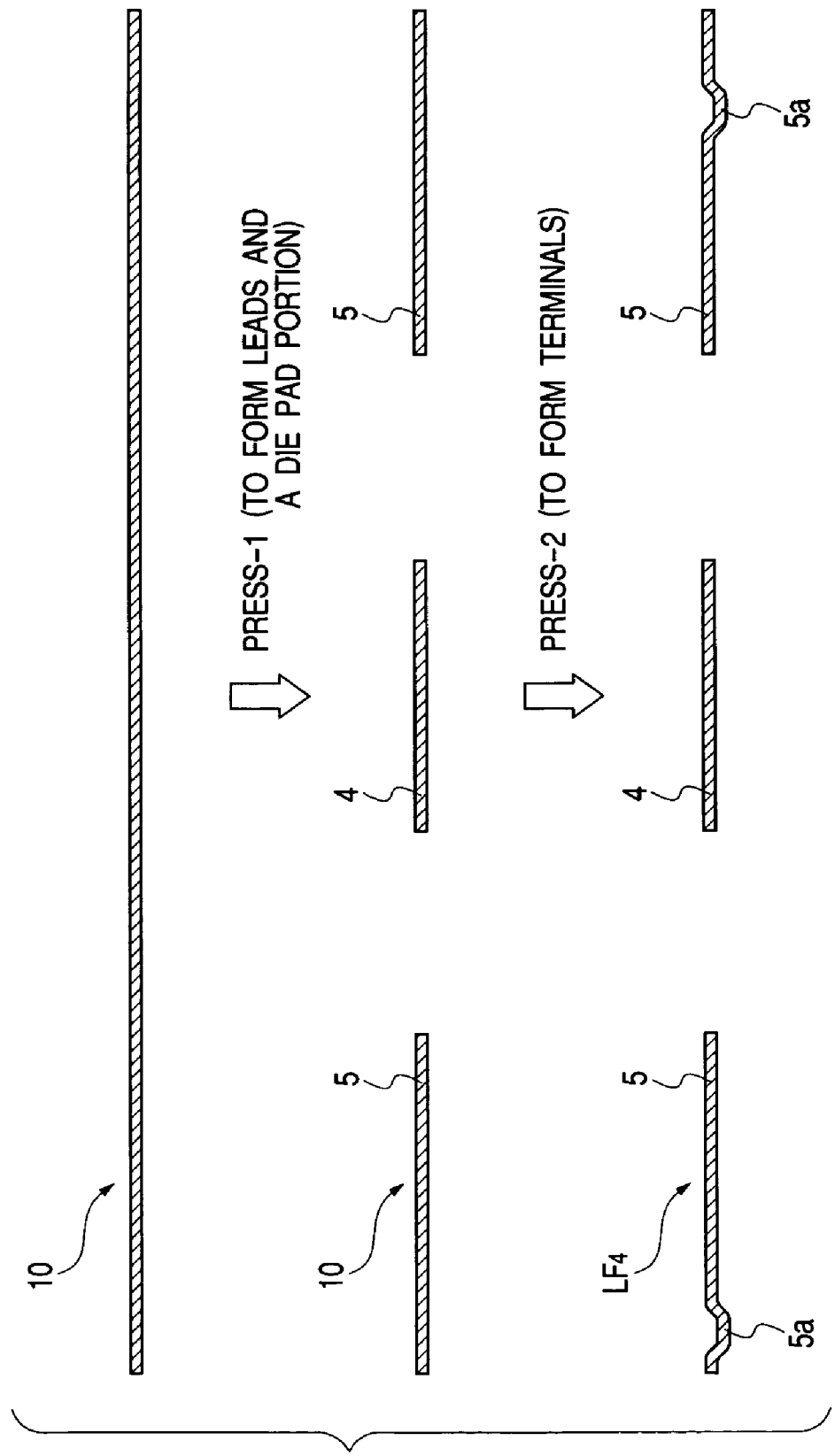
FIG. 54 is an explanatory diagram showing how to fabricate a lead frame used in manufacturing a semiconductor device further embodying the present invention.
Figure 55:
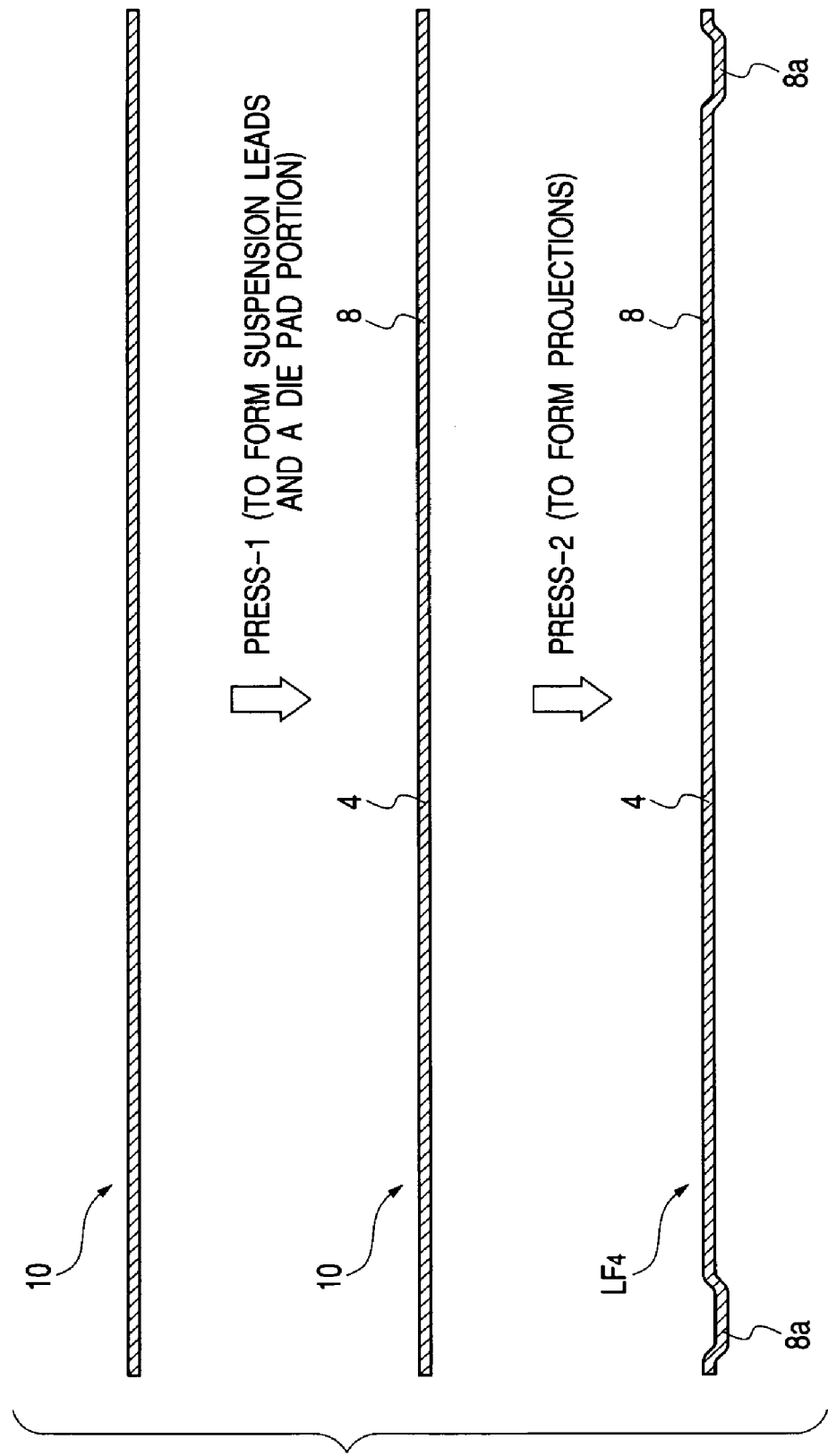
FIG. 55 is an explanatory diagram showing how to fabricate the lead frame illustrated in FIG. 54.

For fabricating the lead frame $LF_4$ by the press method, as shown in FIGS. 54 and 55, first a metallic sheet 10 is punched with a press to form leads 5, suspension leads 8 and a die pad portion 4. Next, the leads 5 are bent halfway downward to form terminals 5a, while the suspension leads 8 are bent downward at a position close to their one ends to form projections 8a. At this time, a part of the die pad portion 4 may be bent downward with a press to form such projections 4a as referred to in the above third embodiment.

Figure 56:
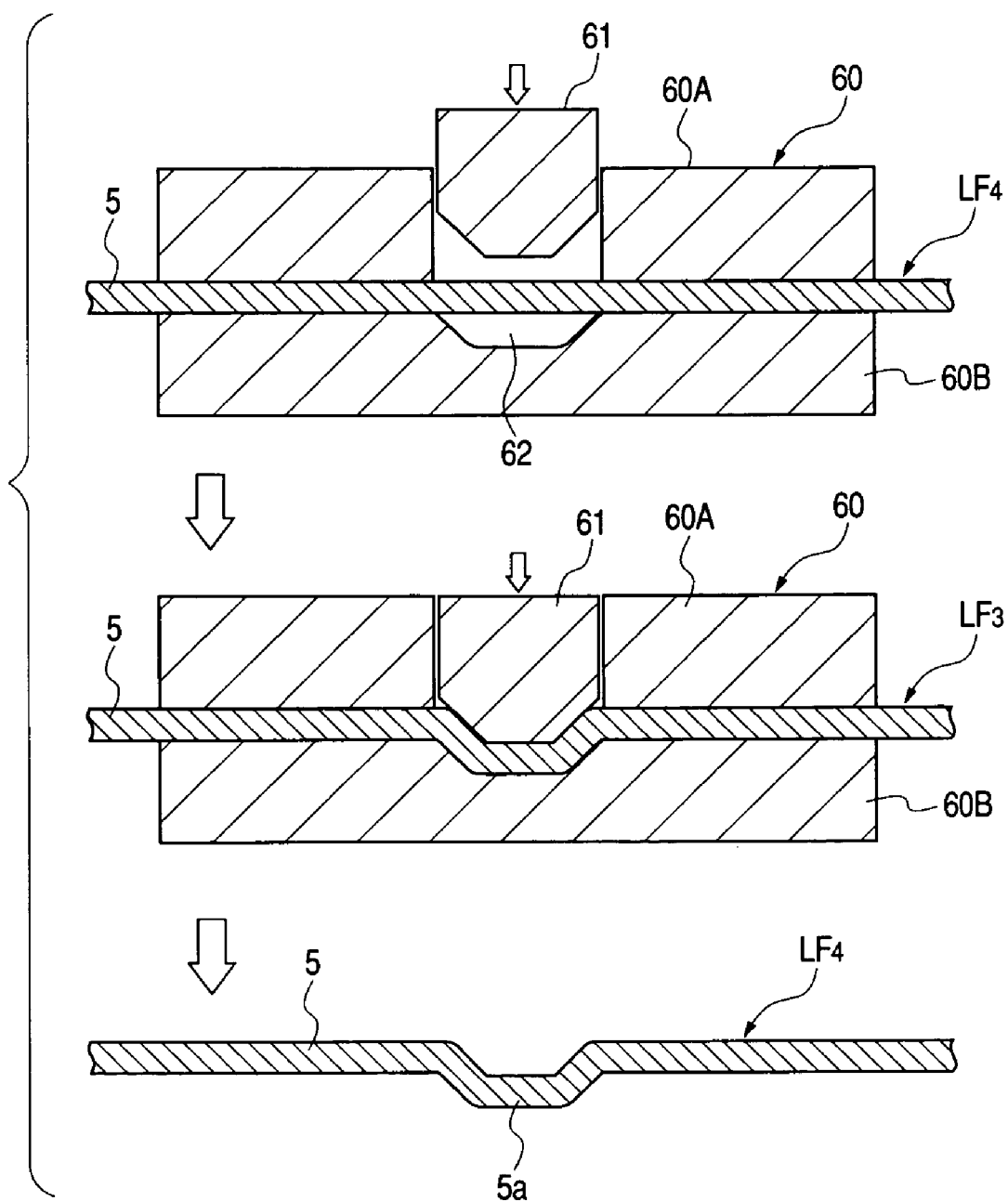
FIG. 56 is an explanatory diagram showing how to fabricate the lead frame illustrated in FIG. 54.

For forming the terminals 5a, as shown in FIG. 56, the metallic sheet 10 is held between an upper die half 60A and a lower die half 60B of a pressing die 60. In this state, a punch 61 provided in the upper die half 60A is pushed into a die 62 formed in the lower die half 60B, whereby intermediate portions of the leads 5 are deformed plastically and are bent downward to form terminals 5a. Though not shown, the projections 8a of the suspension leads 8 and the projections 4a of the die pad portion 4 are also formed in the same manner.

The terminals 5a and the projections 4a, 8a may be formed of a material different from the material of the lead frame. In this case, there is provided a lead frame formed with patterns (die pad portion 4, leads 5 and suspension leads 8) by the foregoing half-etching method or pressing method and resin or the like is applied to portions of the lead frame where terminals 5a and projections 4a, 8a are to be formed. Next, a semiconductor chip 2 is mounted on the lead frame and, after connecting the leads 5 and the semiconductor chip 2 with each other through Au wires 6, resin sealing members 3 are formed using the molding die 40 described above. Then, dummy terminals and projections exposed to the back surface of the resin sealing members 3 are melted off with a solvent and thereafter terminals 5a and projections 4a, 8a are formed there by printing or plating.

Figure 57:
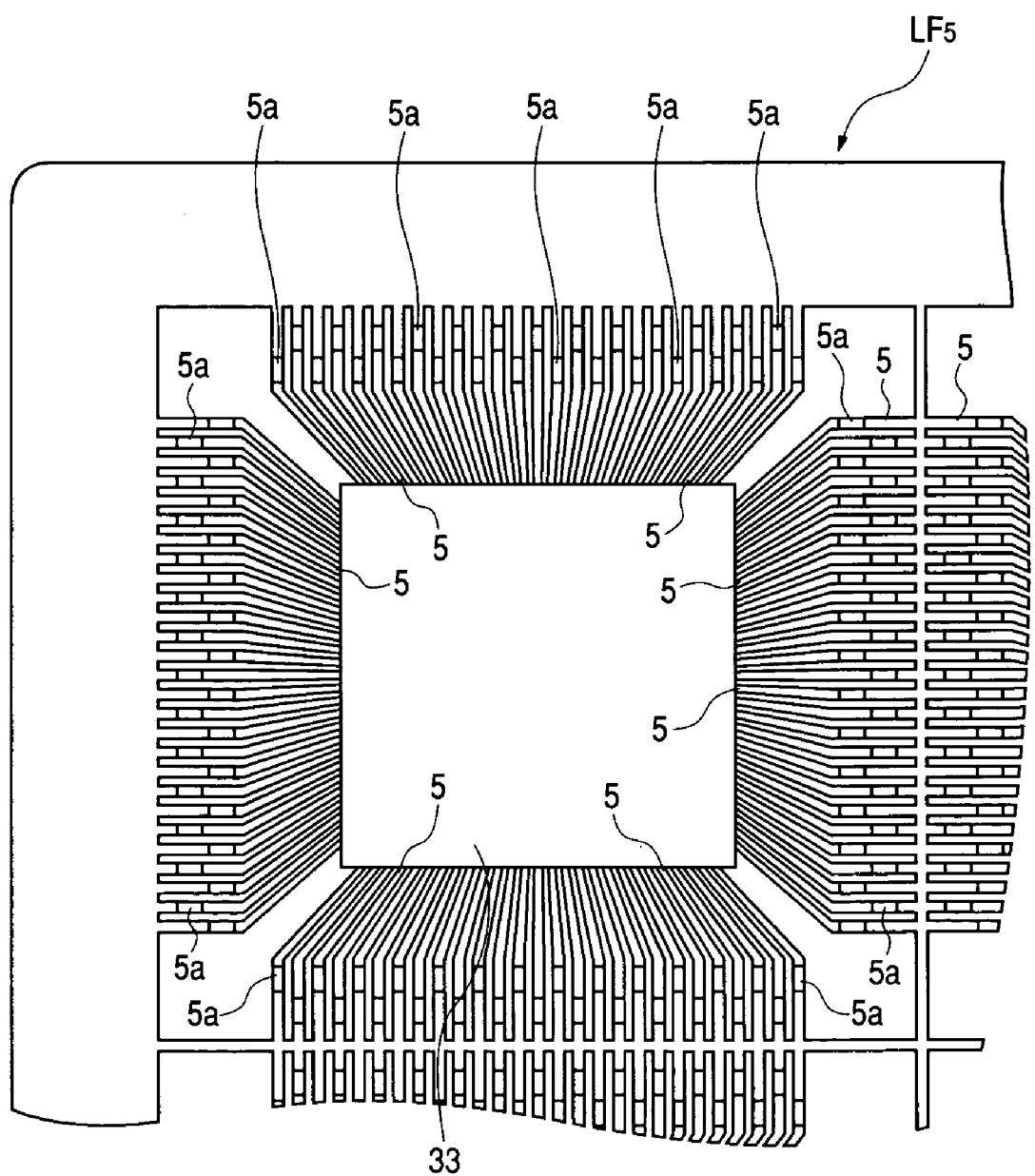
FIG. 57 is a plan view of a principal portion of a lead frame used in manufacturing a semiconductor device further embodying the present invention.

The above lead frame provided with the die pad portion 4 and the suspension leads 8 which support the die pad portion may be substituted by such a lead frame $LF_1$ as shown in FIG. 57 in which a chip support 33 such as a sheet-like insulating film is affixed to one ends of the leads 5 and a semiconductor chip 2 is mounted on the chip support 33. Moreover, as shown in the same figure, the width of each terminal 5a may be set equal to the width of each lead 5 to promote narrowing the pitch of the leads 5.

The following is a brief description of an effect obtained by typical modes of the invention as disclosed herein.

At the time of cutting the lead frame portion exposed to the exterior of resin sealing members by means of a dicer, a peripheral portion of each of the resin sealing members is cut with the dicer to cover the whole peripheries of one end portions of leads exposed to cut faces of the resin sealing member with resin, whereby it is possible to prevent the occurrence of metallic burrs on the cut faces of the leads.

What is claimed is:

1. A semiconductor device comprising:
   a die pad supported by a plurality of suspension leads;
   a semiconductor chip disposed over the die pad;
   a plurality of leads arranged around the semiconductor chip,
   the plurality of leads each having a first end, a second end opposite the first end, an upper surface, a lower surface, side faces, and a terminal disposed between the first end and the second end and providing an electrical connection to a wiring substrate;
   a plurality of wires electrically connecting the semiconductor chip with the first ends of the plurality of leads; and
   a resin sealing member sealing the semiconductor chip, a part of each of the plurality of leads and the plurality of wires;
   wherein the terminals of the plurality of leads are exposed from a back surface of the resin sealing member;
   wherein the upper surface, the lower surface and the side faces of the second ends of the plurality of leads are covered with resin of the resin sealing member;
   wherein a cut face of each of the second ends of the plurality of leads is exposed from a side face of the resin sealing member, and
   wherein one end of each of the plurality of suspension leads is branched in a vicinity of a corner of the resin sealing member, branched portions of said one end are exposed to side faces of the resin sealing member, and each branched portion has an upper surface, a lower surface, and side faces covered by the resin sealing member.

2. A semiconductor device according to claim 1, wherein the plurality of suspension leads are each partially exposed from the back surface of the resin sealing member.

3. A semiconductor device according to claim 1, wherein the terminals are respectively constituted such that portions of the plurality of leads project from a back surface of the resin sealing member.

4. A semiconductor device according to claim 1, wherein the terminals are formed of an electrically conductive material different from a material forming the plurality of leads.

5. A semiconductor device according to claim 1, wherein a back surface of the die pad portion is partially exposed to an exterior from a back surface of the resin sealing member.

6. A semiconductor device according to claim 1, wherein the terminals are arranged zigzag in two rows along sides of the resin sealing member.

7. A semiconductor device according to claim 1, wherein an area of the die pad is smaller than an area of the semiconductor chip.

* * * * *